United States Patent
Fujimoto et al.

(10) Patent No.: US 7,183,144 B2
(45) Date of Patent: Feb. 27, 2007

(54) SEMICONDUCTOR DEVICE AND METHOD OF MANUFACTURING THE SAME

(75) Inventors: Etsuko Fujimoto, Kanagawa (JP); Satoshi Murakami, Kanagawa (JP); Akira Tsunoda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/083,678

(22) Filed: Mar. 18, 2005

(65) Prior Publication Data

US 2005/0161674 A1   Jul. 28, 2005

Related U.S. Application Data

(63) Continuation of application No. 10/017,114, filed on Oct. 24, 2001, now Pat. No. 6,884,664.

(30) Foreign Application Priority Data

Oct. 26, 2000 (JP) .............................. 2000-327879
Sep. 25, 2001 (JP) .............................. 2001-291795

(51) Int. Cl.
*H01L 21/00* (2006.01)
*H01L 21/84* (2006.01)

(52) U.S. Cl. ........................... 438/149; 257/57

(58) Field of Classification Search ............... 257/57, 257/59, 72, 347, 350; 438/149, 150, 387, 438/591, 786
See application file for complete search history.

(56) References Cited

U.S. PATENT DOCUMENTS 4,394,182 A    7/1983   Maddox, III .............. 148/1.5
4,851,363 A    7/1989   Troxell et al. ............. 437/40

(Continued)

FOREIGN PATENT DOCUMENTS

JP       60-127761       7/1985

(Continued)

OTHER PUBLICATIONS

Pending U.S. Appl. No. 09/433,705, including specification, claims, abstract and drawings.

(Continued)

*Primary Examiner*—Phuc T. Dang
(74) *Attorney, Agent, or Firm*—Cook, Alex, McFarron, Manzo, Cummings & Mehler, Ltd.

(57) ABSTRACT

According to the present invention, a pixel TFT (an n-channel TFT) having a considerably low OFF current value and a high ratio of an ON current value to an OFF current value can be realized. In a pixel portion, an electrode having a taper portion with a width of 1 μm or more is formed. An impurity region is formed by adding an impurity through the taper portion, so that the impurity region has a concentration gradient. Then, only the taper portion is removed to form the pixel TFT in the pixel portion. In the impurity region of the pixel TFT in the pixel portion, the concentration gradient is provided in a concentration distribution of the impurity imparting one conductivity, whereby a concentration is made small on the side of a channel forming region and a concentration is made large on the side of a semiconductor layer end portion.

2 Claims, 23 Drawing Sheets

U.S. PATENT DOCUMENTS

| | | | |
|---|---|---|---|
| 5,508,209 A | 4/1996 | Zhang et al. | 437/21 |
| 5,962,872 A | 10/1999 | Zhang et al. | 257/66 |
| 6,031,290 A | 2/2000 | Miyazaki et al. | 257/764 |
| 6,114,715 A | 9/2000 | Hamada | 257/72 |
| 6,118,148 A | 9/2000 | Yamazaki | 257/327 |
| 6,259,120 B1 | 7/2001 | Zhang et al. | 257/72 |
| 6,365,917 B1 * | 4/2002 | Yamazaki | 257/72 |
| 6,562,669 B2 | 5/2003 | Suzawa et al. | 438/158 |
| 6,587,165 B2 | 7/2003 | Hashimoto et al. | 349/44 |
| 6,632,708 B2 | 10/2003 | Sakama et al. | 438/149 |
| 6,646,287 B1 | 11/2003 | Ono et al. | |
| 6,759,678 B2 * | 7/2004 | Yamazaki | 257/59 |
| 6,884,664 B2 * | 4/2005 | Fujimoto | 438/149 |
| 7,008,828 B2 | 3/2006 | Ono et al. | |
| 2004/0053451 A1 | 3/2004 | Ono et al. | |
| 2006/0113597 A1 | 6/2006 | Ono et al. | |

FOREIGN PATENT DOCUMENTS

| | | |
|---|---|---|
| JP | 04-258160 | 9/1992 |
| JP | 05-075033 | 3/1993 |
| JP | 06-148685 | 5/1994 |
| JP | 06-196494 | 7/1994 |
| JP | 07-142734 | 6/1995 |
| JP | 07-235680 | 9/1995 |
| JP | 08-264784 | 10/1996 |
| JP | 08-274336 | 10/1996 |
| JP | 2000-208778 | 7/2000 |
| JP | 2000-216396 | 8/2000 |
| JP | 2000-216398 | 8/2000 |
| JP | 2000-223716 | 8/2000 |
| JP | 2000-228527 | 8/2000 |
| JP | 2000-236097 | 8/2000 |
| JP | 2000-243975 | 9/2000 |
| JP | 2001-094113 | 4/2001 |
| JP | 2001-094116 | 4/2001 |
| JP | 2001-111060 | 4/2001 |
| JP | 2001-210832 | 8/2001 |

OTHER PUBLICATIONS

Pending U.S. Appl. No. 09/436,984, including specification, claims, abstract and drawings.
Pending U.S. Appl. No. 09/447,574, including specification, claims, abstract and drawings.
Pending U.S. Appl. No. 09/464,200, including specification, claims, abstract and drawings.
Pending U.S. Appl. No. 09/471,359, including specification, claims, abstract and drawings.
Pending U.S. Appl. No. 09/714,891, including specification, claims, abstract and drawings.
Pending U.S. Appl. No. 09/432,662, including specification, claims, abstract and drawings.
Pending U.S. Appl. No. 09/435,154, including specification, claims, abstract and drawings.
Pending U.S. Appl. No. 09/441,025, including specification, claims, abstract and drawings.
Pending U.S. Appl. No. 09/454,146, including specification, claims, abstract and drawings.
Pending U.S. Appl. No. 09/618,930, including specification, claims, abstract and drawings.
Pending U.S. Appl. No. 09/619,732, including specification, claims, abstract and drawings.

* cited by examiner

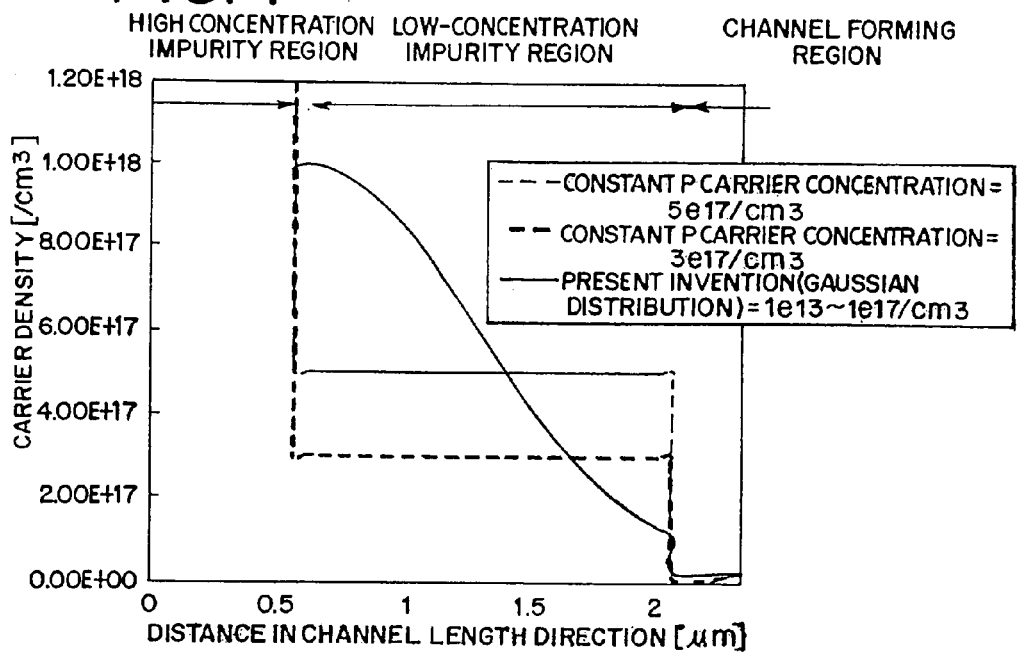
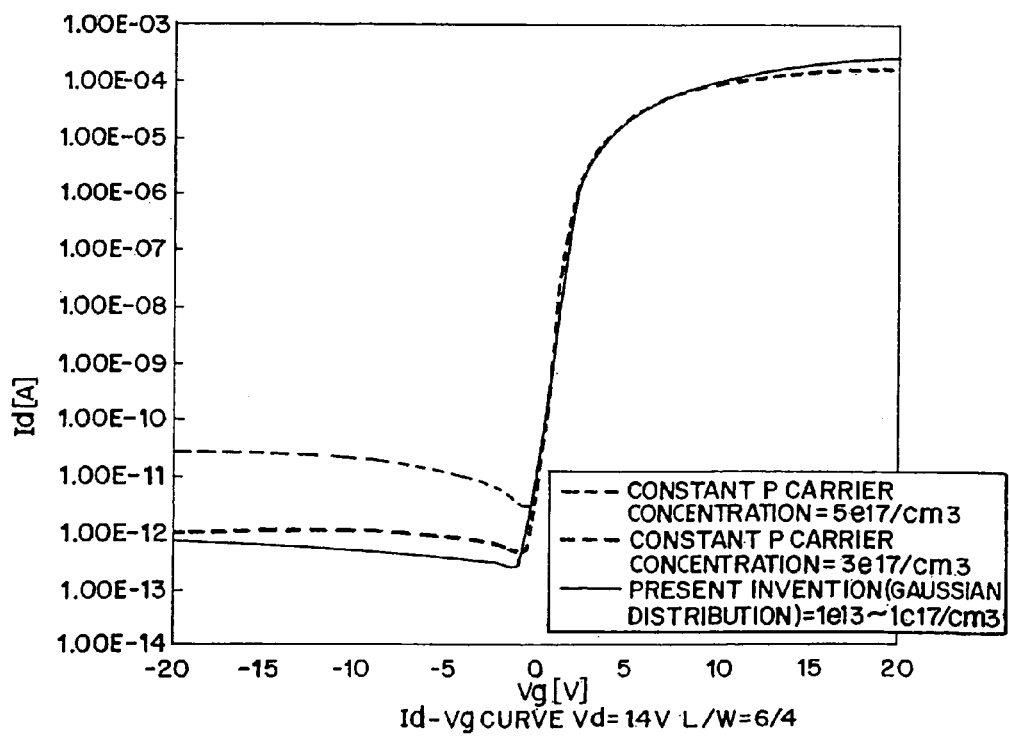

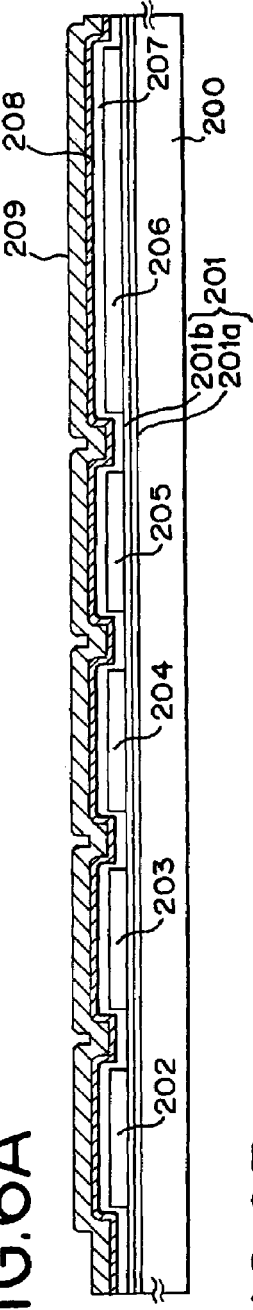
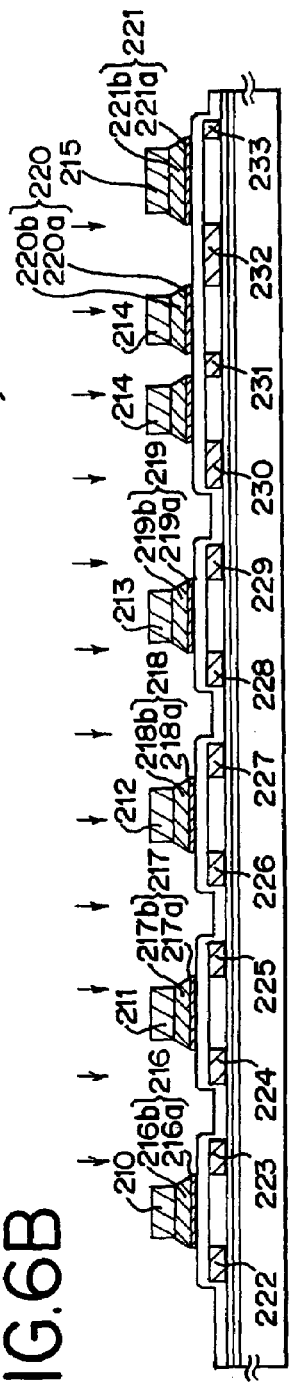
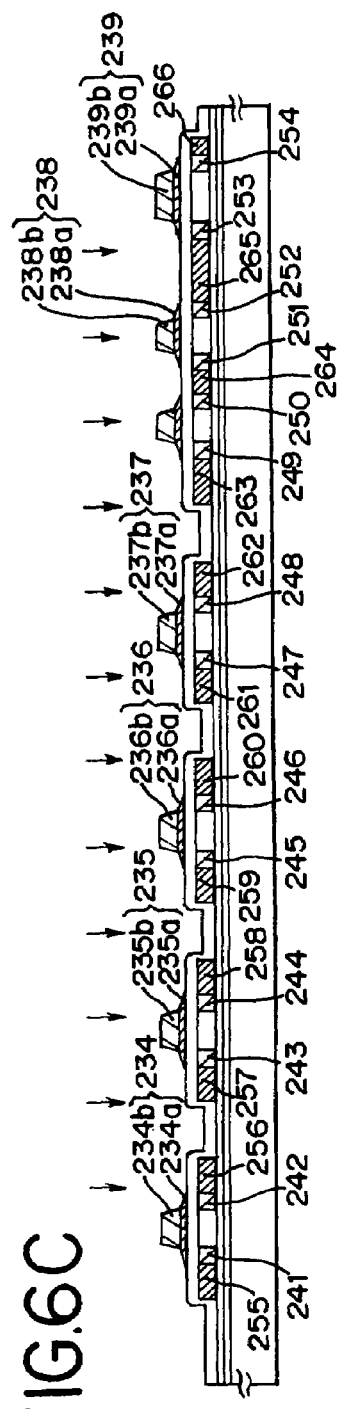
FIG.6A
FIG.6B
FIG.6C

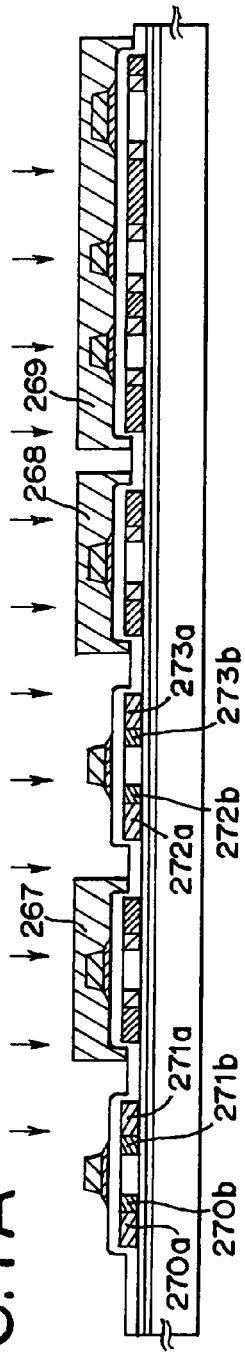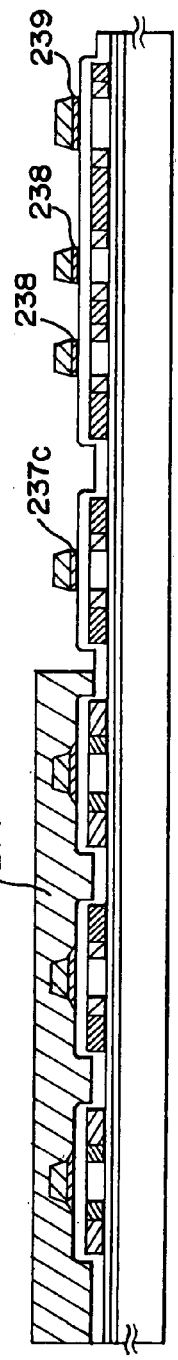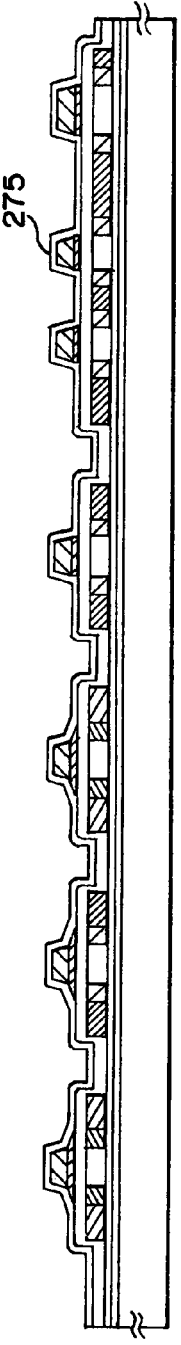

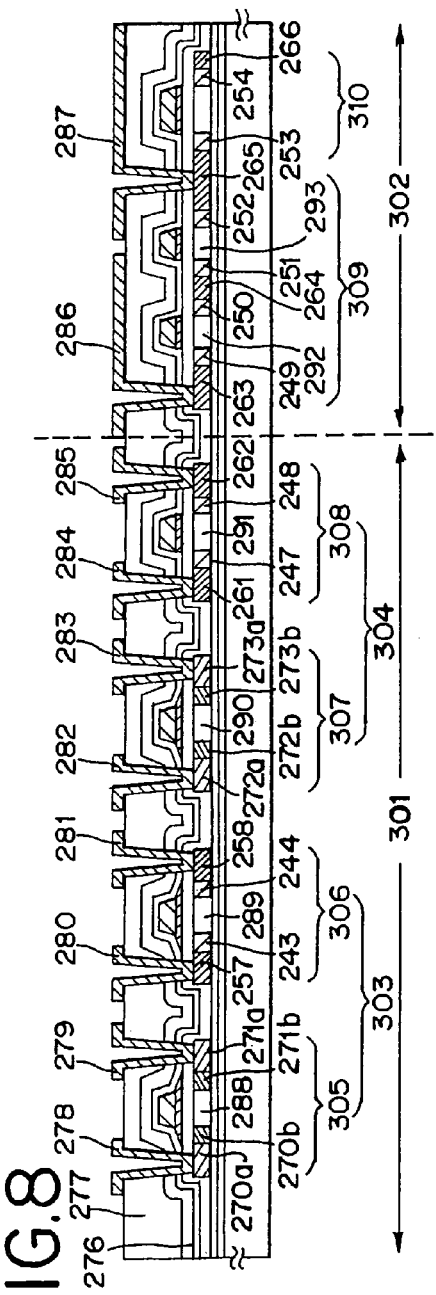
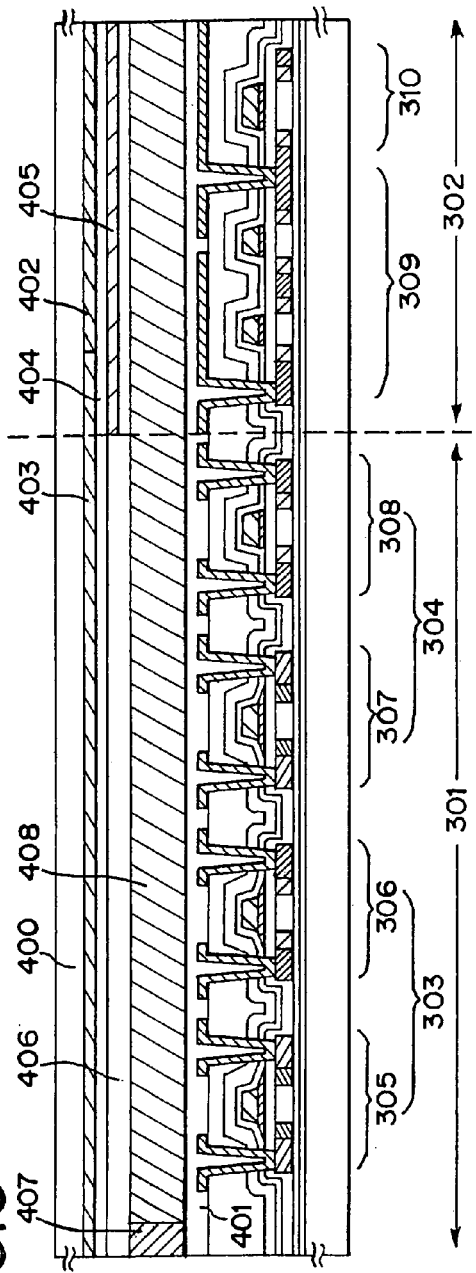

TEM PHOTOGRAPH
(CROSS SECTION)

TEM PHOTOGRAPH
(CROSS SECTION)

DRIVING CIRCUIT TFT
10-YEAR GUARANTEE VOLTAGE

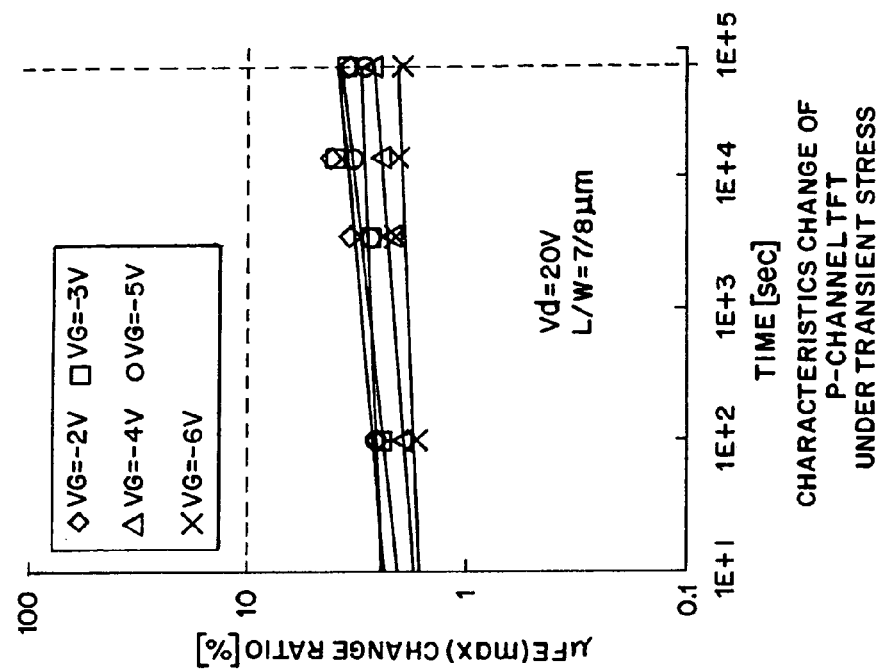
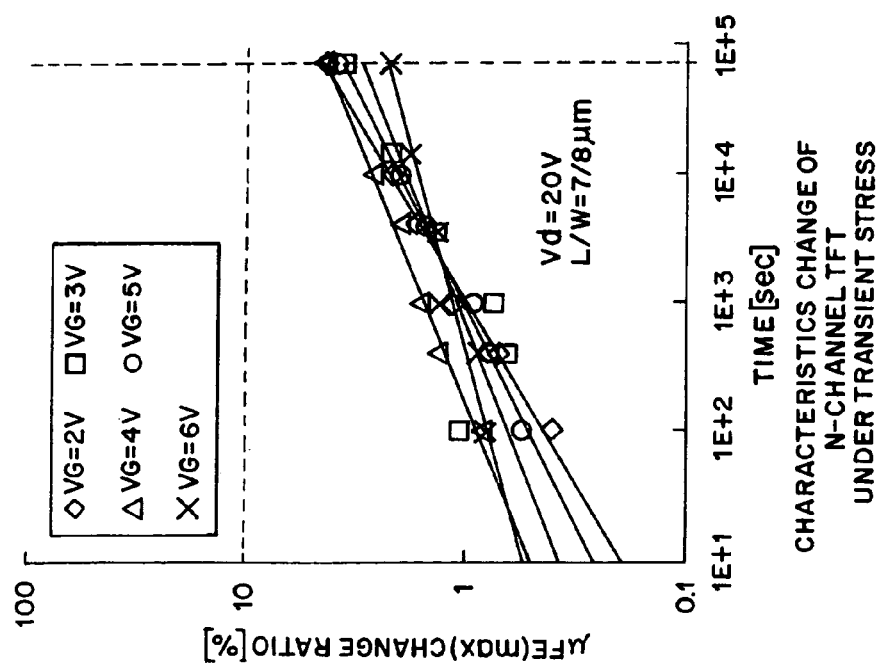

PHOSPHORUS CONCENTRATION DISTRIBUTION (SIMS ANALYSIS) IN GI(SiON;1100Å) AND SEMICONDUCTOR LAYER (Si) IN SECOND DOPING PROCESS

Ion/Ioff RATIO

LIGHT EMITTING DIRECTION

DEPENDENCE ON LOV LENGTH OF ESTIMATED
GUARANTEE VOLTAGE
(10% OF ON CURRENT IS DEGRADATED)
(Lg/W = 10/8μm)

VARIATION OF LINE WIDTH DESIGN SIZE AND LOV LENGTH

SEMICONDUCTOR DEVICE AND METHOD OF MANUFACTURING THE SAME

This application is a continuation of U.S. application Ser. No. 10/017,114, filed on Oct. 24, 2001 now U.S. Pat. No. 6,884,664.

BACKGROUND OF THE INVENTION

1. Field of the Invention

The present invention relates to a semiconductor device having a circuit composed of thin film transistors (hereinafter, referred to as "TFTs"), and a method of manufacturing the same. In particular, the present invention relates to electronic equipment provided with a liquid crystal module, an EL module, and the like as its parts.

In the present specification, a semiconductor device refers to all the devices that function by using semiconductor characteristics, and includes an electro optical device, a light-emitting device, a semiconductor circuit, and electronic equipment.

2. Description of the Related Art

In recent years, semiconductor devices have been developed, which include a large integrated circuit formed of thin film transistors (TFTs), each TFT being formed of semiconductor films (thickness: about several nm to about several hundreds of nm) provided over a substrate having an insulating surface. Representative examples of the semiconductor device include an active matrix type liquid crystal module, an EL module, and a contact type image sensor. In particular, a TFT (hereinafter, referred to as a "polysilicon TFT") utilizing a crystalline silicon film (typically, a polysilicon film) has high electric field effect mobility, so that it is capable of forming a circuit with various functions.

For example, in a liquid crystal module provided in a liquid crystal display apparatus, on the functional block basis a pixel circuit for conducting a pixel display, and a driving circuit for controlling pixel circuits such as a shift register circuit, a level shifter circuit, a buffer circuit, and a sampling circuit based on a CMOS circuit are formed on one substrate.

Furthermore, in a pixel circuit of an active matrix type liquid crystal module, a TFT (pixel TFT) is disposed for each of several tens to several millions of pixels, respectively, and a pixel electrode is provided for each pixel TFT. A counter electrode is provided on a substrate opposite to the pixel electrode with liquid crystal therebetween. Thus, a kind of capacitor using liquid crystal as a dielectric is formed. A voltage applied to each pixel is controlled by a switching function of a TFT, and liquid crystal is driven by controlling a charge to the capacitor, whereby the amount of transmitted light is controlled to display an image.

A pixel TFT is made of an n-channel TFT, and functions as a switching element to drive liquid crystal by applying a voltage. Liquid crystal is driven with an A.C. voltage, so that a system called frame inversion driving is mostly adopted. According to this system, in order to suppress power consumption, a pixel TFT is required to have characteristics of keeping an OFF current value (drain current flowing during an off operation of a TFT) sufficiently low.

As a structure of a TFT for reducing an OFF current value, a lightly doped drain (LDD) structure is known. In this structure, a region (called an LDD region) with low-concentration impurity elements added thereto is provided between a channel forming region and a source region/drain region formed by adding high-concentration impurity elements thereto.

In the case where a typical LDD region is formed in a conventional pixel TFT, an OFF current value can be reduced. However, an ON current value is also decreased. Although a typical LDD structure can suppress an OFF current value, the ability of the LDD structure of alleviating an electric field in the vicinity of a drain to prevent degradation due to hot carrier injection is low.

Furthermore, as means for preventing a decrease in an ON current value due to hot carriers, a so-called GOLD (gate-drain overlapped LDD) structure is known in which an LDD region and a gate electrode are overlapped with each other via a gate insulating film. In such a structure, an electric field intensity in the vicinity of a drain is alleviated to prevent injection of hot carriers, which is effective for preventing a degradation phenomenon.

Furthermore, a GOLD structure has a high ability of preventing a decrease in an ON current value, whereas it has a high OFF current value compared with a typical LDD structure. Thus, the GOLD structure is not preferable for being applied to a typical TFT.

In a semiconductor device having a plurality of integrated circuits such as an active matrix type liquid crystal display apparatus, the above-mentioned problems become conspicuous particularly in a crystalline silicon TFT, and they become more conspicuous as the performance required for an active matrix type liquid crystal display apparatus is enhanced.

SUMMARY OF THE INVENTION

Therefore, with the foregoing in mind, it is an object of the present invention to enhance operation characteristics and to lower power consumption in an electro optical apparatus and a semiconductor device such as an active matrix type liquid crystal display apparatus manufactured using a TFT.

In particular, it is an object of the present invention to obtain a structure of a pixel TFT (n-channel TFT) with a low OFF current value. It is another object of the present invention to obtain a structure of a pixel TFT having a high ratio of an ON current value to an OFF current value.

As shown in FIG. 1A, the present invention is characterized in that an impurity region 102 includes a region 102a having a concentration gradient in which a concentration of an impurity element imparting one conductivity type is increased with distance (in a channel length direction) from a channel forming region.

More specifically, the present invention is characterized in that there is provided an impurity region in which a concentration of an impurity element (phosphorus) is gradually increased with distance from an end portion of a gate electrode 105 (end portion of the gate electrode in a cross-section in the channel length direction) to a peripheral portion of a semiconductor layer. Thus, in the impurity region, an electric resistance is large on the side of a channel forming region and is small on the side of a peripheral portion of the semiconductor layer.

Furthermore, according to the present invention, a concentration of an impurity element in the impurity region is continuously increased. Therefore, there is no clear border (boundary). In the present specification, a region of the impurity region 102, which has an impurity concentration of $1 \times 10^{20}/cm^3$ or more, is referred to as a drain region 102b.

Although the drain side has been described, it is preferable to design a source side in the same way as in the drain side in the case of a pixel TFT. In an impurity region on the source side, a region 103a is formed, having a concentration gradient in which a concentration of an impurity element imparting one conductivity type is increased with distance from the channel forming region. Furthermore, in the present specification, a region of the impurity region on the source side, having an impurity concentration of $1\times10^{20}/cm^3$ or more, is referred to as a source region 103b.

The present invention is characterized in that a TFT having a considerably low OFF current value and a high ratio of an ON current value to an OFF current value is realized by intentionally forming the regions 102a and 103a having the above-mentioned concentration gradient. The gate electrode 105 is overlapped with a channel forming region 101 via a gate insulating film 1. However, it is not overlapped with the impurity region 102. As shown in FIG. 1A, reference numeral 100 denotes a substrate having an insulating surface, 106 denotes an interlayer insulating film, 107 denotes a source electrode, and 108 denotes a drain electrode.

In a conventional TFT structure, as shown in FIG. 29, there is a clear border due to a difference in concentration, and a concentration is varied in a step-like form among a channel forming region 1, a low-concentration impurity region 2, and a high-concentration impurity region 3. That is, a discontinuous concentration distribution is exhibited. In addition, the concentration of each region is almost constant. Thus, in the prior art, the difference in concentration at a border (boundary) between the high-concentration impurity region 3 and the low-concentration impurity region 2, and the difference in concentration at a border (boundary) between the low-concentration impurity region 2 and the channel forming region 1 are relatively large. Therefore, an electric field is concentrated in the vicinity of each border.

An OFF current flows due to a quantum mechanical effect such as tunneling current between bands, so that it is mainly influenced by an electric field. Therefore, an electric field concentrated at a border causes an OFF current value of a TFT to increase. Particularly in the conventional TFT structure, a stronger electric field is concentrated at a border between a channel forming region and a low-concentration impurity region due to a large difference in concentration.

According to the present invention, an impurity region in which a concentration is continuously increased is provided between the channel forming region and the drain region to eliminate a clear border (boundary) therebetween. Because of this, an electric field concentrated in the vicinity of the border is alleviated to obtain a TFT structure with a low OFF current value.

According to the present invention, as shown in FIG. 1A, it is most desirable that a concentration gradient eliminating a border (boundary) due to the difference in concentration of an impurity element in a semiconductor layer is formed in the impurity region 102 (in a range of $1\times10^{15}/cm^3$ to $1\times10^{21}/cm^3$). However, even by decreasing the difference in concentration between the channel forming region 101 and the impurity region 102a in the vicinity thereof, the effects of the present invention are also obtained. Furthermore, even by decreasing the difference in concentration at a border between the high-concentration impurity region 102b and the low-concentration impurity region 102a in the vicinity thereof, the effects of the present invention can be obtained.

FIG. 1B is a graph showing simulation results in the case where the TFT structure is as shown in FIG. 1A, the channel length L is 6 µm, the channel width W is 4 µm, the thickness of the gate insulating film 104 is 115 nm, the thickness of a polysilicon film is 45 nm, the region 102a (width: 1.5 µm) has a concentration gradient in a range of an impurity concentration (P concentration) of $1\times10^{17}$ to $1\times10^{13}/cm^3$, the impurity region 102b has an impurity concentration (P concentration) of $1\times10^{19}/cm^3$, and the carrier concentration (B concentration) of the channel forming region 101 is $2\times10^{16/cm3}$. The vertical axis of the graph represents an electric field intensity E on the surface of the semiconductor layer (V/cm), and the horizontal axis represents a distance (µm) from the channel forming region. A solid line in FIG. 1B represents a state of an electric field concentrated in the impurity region of the present invention.

In FIG. 1B, a broken line represents, as a conventional example, a state of an electric field concentrated in the low-concentration impurity region 2 under the condition that a concentration distribution in the semiconductor layer of a TFT is as shown in FIG. 29.

As shown in FIG. 1B, according to the present invention, there is provided at least an impurity region having a concentration gradient in an impurity concentration (P concentration) of $1\times10^{17}$ to $1\times10^{18}/cm^3$, whereby an electric field intensity on the surface of the semiconductor layer can be alleviated compared with the prior art. Thus, according to the present invention, a TFT can be obtained in which a strong electric field is not concentrated over the entire region of the semiconductor layer, and an OFF current value is low.

According to the constitution disclosed in the present specification, there is provided a semiconductor device including a TFT having a semiconductor layer formed on an insulating surface, an insulating film (gate insulating film) formed on the semiconductor layer, and a gate electrode formed on the insulating film, wherein the semiconductor layer includes a channel forming region overlapped with the gate electrode, and an impurity region (including an LDD region, a source region, or a drain region) formed in contact with the channel forming region, and the impurity region has a concentration distribution in which a concentration of an impurity element imparting one conductivity type is increased with distance from the channel forming region.

Furthermore, according to the above-mentioned constitution, the impurity element imparting one conductivity type to the semiconductor layer is phosphorus (P) or arsenic (As), and an n-channel TFT is obtained. The n-channel TFT is suitable for a TFT of a pixel portion due to its low OFF current.

Furthermore, in the TFT of the pixel portion; even if an offset region is formed between the channel forming region and the low-concentration impurity region, similar reliability can be obtained. FIG. 18 shows an example thereof.

According to another constitution of the present invention, there is provided a semiconductor device including a TFT having a semiconductor layer formed on an insulating surface, an insulating film formed on the semiconductor layer, and a gate electrode formed on the insulating film, wherein the semiconductor layer includes a channel forming region overlapped with the gate electrode, an offset region formed in contact with the channel forming region, and an impurity region formed in contact with the offset region, and the impurity region has a concentration distribution in which an impurity concentration is increased with distance from the channel forming region.

In the above-mentioned constitution, an end portion of the gate electrode is substantially aligned with an interface between the channel forming region and the offset region.

Furthermore, in a semiconductor device including a pixel portion and a driving circuit on the same insulating surface, it is preferable that a TFT in the pixel portion is made an impurity region not overlapped with the gate electrode with an insulating film (gate insulating film) interposed therebetween. In this case, an end portion of the gate electrode of a pixel TFT is substantially aligned with an interface (border) between the channel forming region and the impurity region.

In the above-mentioned constitution, the gate electrode of an n-channel TFT of the driving circuit has a taper portion, and the taper portion is overlapped with a part of the impurity region with an insulating film (gate insulating film) interposed therebetween. Since doping is conducted through the taper portion, in the driving circuit, the width of the taper portion is substantially matched with the width of a region having a concentration distribution in which an impurity concentration is increased with distance from the channel forming region. Further, as shown in FIG. 32, in a case that a width of wiring to be designed is made long, the taper portion to be formed is also long. Thus, it is preferable to design a width of the gate electrode in the driving circuit larger than a width of the gate electrode in the pixel portion.

In the above-mentioned structure, an offset region may be provided between the channel forming region of the pixel TFT and the impurity region.

Furthermore, in each of the above-mentioned constitutions, the gate electrode has a layered structure including a first conductive layer as a lower layer and a second conductive layer as an upper layer. According to the present invention, an impurity region having a concentration gradient is formed utilizing a gate electrode of the layered structure. Thus, the impurity regions in which an impurity concentration is increased with distance from the channel forming region are formed on both sides of the channel forming region.

Furthermore, in each of the above-mentioned constitutions, the impurity region includes a source region or a drain region.

In the impurity region, an impurity concentration is increased with distance increased from the channel forming region. FIG. 1 shows this concentration distribution as a normal distribution. However, the present invention is not limited thereto. The concentration distribution may be an exponential distribution, a linear distribution with a tilt, or a combination thereof. It should be noted that it is important to prescribe the width of respective regions 102a and 103a having the concentration gradient in the channel length direction to be at least 0.5–1.7 μm, preferably 1 μm or more, and to provide a gentle concentration gradient in the regions.

More specifically, in each of the above-mentioned constitutions, the impurity region includes a region having a concentration distribution in which an impurity concentration is increased, and a region having a substantially constant impurity concentration, and the region having a concentration distribution in which the impurity concentration is increased has a length of 1 μm or more in the channel length direction.

Furthermore, according to the conventional method, an impurity element enters a lower portion of the gate electrode depending upon the doping conditions, and an impurity region of about 0.1 μm overlapped with the gate electrode and having a concentration gradient may be generated. In this case, it is difficult to obtain the same effects as those of the present invention.

In the prior art, doping of an impurity element is conducted using a patterned resist mask or in a self-alignment manner using wiring as a mask. Therefore, a step-like concentration distribution is formed as shown in FIG. 29, and an impurity region of 0.5 μm or more having the constitution of the present invention (i.e., concentration gradient) cannot be obtained.

According to the present invention, it is also possible that not only a gate electrode having a layered structure but also a part of an insulating film (gate insulating film) covering a semiconductor layer is tapered, and an impurity region having a concentration gradient is formed by utilizing the insulating film. In this case, the impurity region is characterized in that the thickness of the insulating film is different between a region placed at a largest distance from the channel forming region and a region placed at a smallest distance therefrom. It is also possible to form an impurity region having a concentration gradient using a gate electrode having a taper portion and an insulating film having a taper portion.

The present invention is also characterized by a manufacturing method for obtaining the above-mentioned structure.

According to the constitution of the present invention regarding a manufacturing method realizing the above-mentioned structure, there is provided a method of manufacturing a semiconductor device including the steps of: forming a semiconductor layer on an insulating surface; forming an insulating film on the semiconductor layer; forming a conductive layer having a taper portion on the insulating film (gate insulating film); adding an impurity element imparting one conductivity type to the semiconductor layer by allowing the impurity element to pass through the taper portion and the insulating film, thereby forming an impurity region in which an impurity concentration is increased toward an end portion of the taper portion; and selectively removing only a taper portion of the conductive layer to form a gate electrode.

In the constitution of the above-mentioned manufacturing method, doping is conducted by allowing an impurity element to pass through a taper portion made of a conductive layer to form an impurity region having a concentration gradient.

On the other hand, according to the conventional manufacturing method, doping of an impurity element is conducted using a resist mask formed by using a photomask, whereby an LDD region, a source region, and a drain region are formed.

In the above-mentioned constitution, an impurity element imparting one conductivity type to the semiconductor layer is added by being allowed to pass through the taper portion, and an impurity region in which an impurity concentration is increased toward an end portion of the taper portion has a concentration gradient at least in an impurity concentration (P concentration) of $1\times10^{17}$ to $1\times10^{18}/cm^3$.

It is also possible that a driving circuit and a pixel portion are formed on the same substrate. In this case, it is preferable that only a taper portion is selectively removed at least in a gate electrode of a TFT of the pixel portion, and a taper portion of a gate electrode of a TFT (where an ON current is important) of the driving circuit is left as it is. Furthermore, in the TFT of the driving circuit, reliability becomes higher as the width of the taper portion in the channel length direction is larger. Therefore, for forming the taper portion, it is effective to conduct dry etching with etching gas containing $SF_6$ having a high selection ratio so that the width of the taper portion becomes longer.

Furthermore, it is also possible that not only a gate electrode having a layered structure but also a part of an insulating film (gate insulating film) covering a semiconductor layer are tapered, and an impurity region having a concentration gradient is formed by utilizing the insulating film. According to another constitution regarding a manufacturing method realizing the above-mentioned structure, there is provided a method of manufacturing a semiconductor device including the steps of: forming a semiconductor layer on an insulating surface; forming an insulating film on the semiconductor layer; forming a gate electrode on the insulating film; etching the insulating film to form an insulating layer having a taper portion on the semiconductor layer; and adding an impurity element imparting one conductivity type to the semiconductor layer by allowing the element to pass through the taper portion, thereby forming an impurity region in which an impurity concentration is increased toward an end portion of the taper portion.

In the above-mentioned constitution of the manufacturing method, doping is conducted by allowing an impurity element to pass through a taper portion made of an insulating layer, and an impurity region having a concentration gradient is formed.

BRIEF DESCRIPTION OF THE DRAWINGS

FIG. 4 is a graph showing a carrier density distribution of simulation of the present invention;

FIG. 5 is a graph showing TFT characteristics according to simulation of the present invention;

FIGS. 6A to 6C illustrate manufacturing processes of an active matrix type liquid crystal display device of Embodiment 1;

FIGS. 7A to 7C illustrate manufacturing processes of an active matrix type liquid crystal display of Embodiment 1;

FIG. 8 illustrates manufacturing processes of an active matrix type liquid crystal display apparatus of Embodiment 1;

FIG. 9 is a cross-sectional view of a liquid crystal module of Embodiment 2;

FIGS. 17A and 17B show reliability data (transient stress) of a TFT in a driving circuit of Embodiment 1;

DESCRIPTION OF THE PREFERRED EMBODIMENTS

Embodiment Mode

Figure 1A:
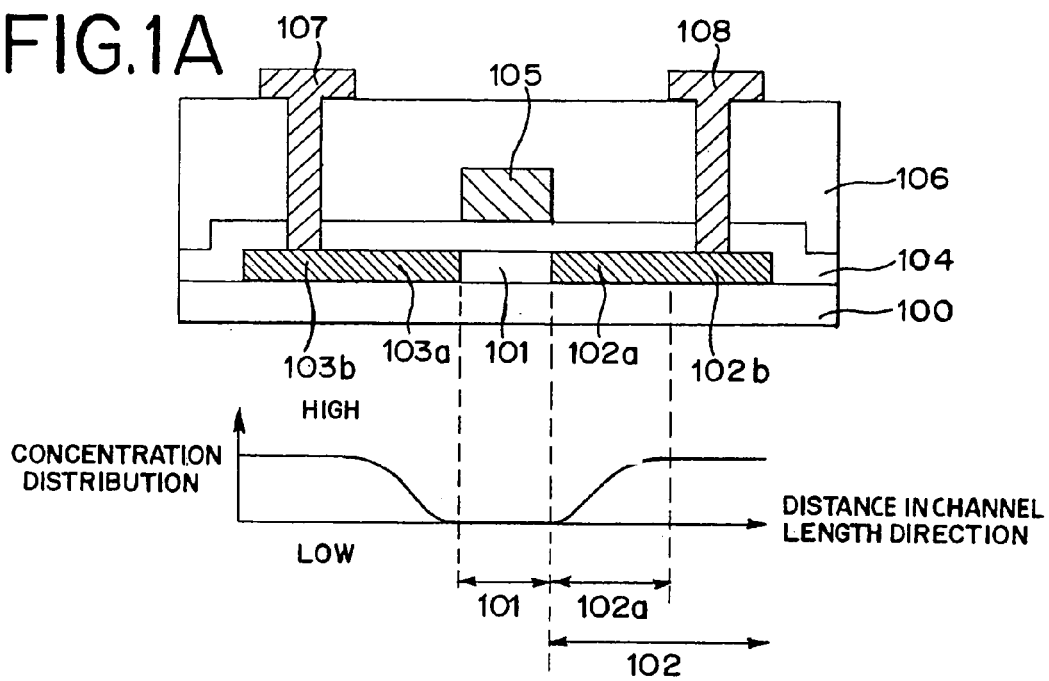
FIGS. 1A and 1B show a constitution of the present invention.

Hereinafter, the present invention will be described by way of illustrative embodiments with reference to FIGS. 2A to 2D and 3A to 3D.

Herein, an impurity region is formed in which an impurity concentration (P concentration) is continuously increased from a channel forming region side to an impurity region side, by utilizing taper portions of a gate electrode.

First, an underlying insulating film 11 is formed on a substrate 10. As the substrate 10, a glass substrate, a quartz substrate, a silicon substrate, or a metal substrate or a stainless steel substrate with an insulating film formed thereon may be used. Furthermore, a plastic substrate having heat resistance enduring a treatment temperature may be used.

Furthermore, as the underlying insulating film 11, an underlying film 11 made of an insulating film such as a silicon oxide film, a silicon nitride film, or a silicon oxide nitride film is formed. Herein, as the underlying film 11, two-layered structure (11a, 11b) is shown. However, a single layered structure or two or more layered structure of the insulating film may be used. The underlying insulating film 11 may not be formed.

Then, a semiconductor layer 12 is formed on the underlying film 11. The semiconductor layer 12 is provided by forming a semiconductor film having an amorphous structure by a known method (sputtering, LPCVD, plasma CVD, or the like), subjecting the semiconductor film to a known crystallization processing (laser crystallization, thermal crystallization, thermal crystallization using a catalyst such as nickel, or the like) to obtain a crystalline semiconductor film, and patterning the crystalline semiconductor film into a desired shape using a first photomask. The semiconductor layer 12 is formed to a thickness of 25 to 80 nm (preferably, 30 to 60 nm). There is no particular limit regarding the material for the crystalline semiconductor film. However, preferably the crystalline semiconductor film may be formed of a silicon or silicon germanium (SiGe) alloy.

Then, an insulating film 13 is formed so as to cover the semiconductor layer 12.

The insulating film 13 is formed to a thickness of 40 to 150 nm so as to have a single layered structure or a multi-layered structure of an insulating film containing silicon by plasma CVD or sputtering. The insulating film 13 is to be a gate insulating film.

Figure 2A:
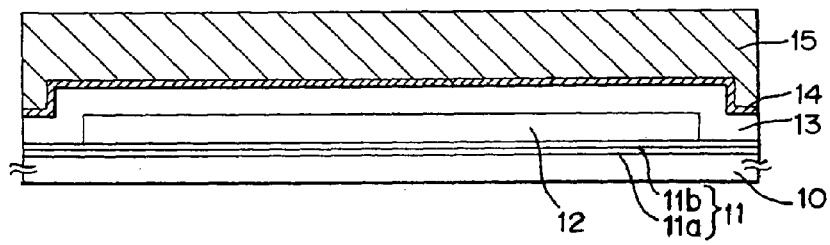
FIGS. 2A to 2D illustrate manufacturing processes according to the present invention.

Then, a first conductive film 14 having a thickness of 20 to 100 nm and a second conductive film 15 having a thickness of 100 to 400 nm are laminated on the insulating film 13 (FIG. 2A). The first conductive film 14 made of a TaN film and the second conductive film 15 made of a W film are stacked by sputtering. Herein, the first conductive film 14 is made of TaN, and the second conductive film 15 is made of W. However, the present invention is not limited thereto. The first and second conductive films 14 and 15 may be formed of an element selected from Ta, W, Ti, Mo, Al, and Cu, or formed of an alloy material or a compound material containing these elements as main components thereof. A semiconductor film such as a polycrystalline silicon film doped with impurity elements such as phosphorus may be used.

Figure 2B:
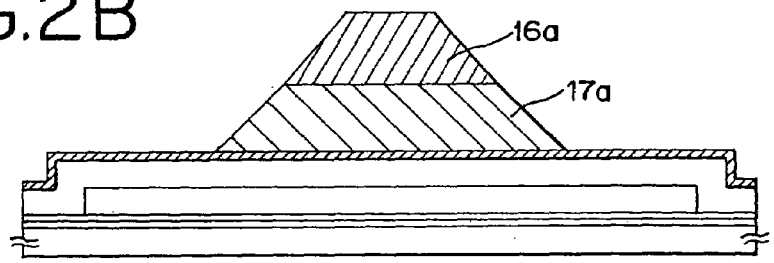

Then, a resist mask 16a is formed by using a second photomask, and first etching is conducted using an ICP etching apparatus. During the first etching process, the second conductive film 15 is etched, whereby a second conductive layer 17a having tapered configurations (taper portions) at end portions is obtained as shown in. FIG. 2B.

An angle of the taper portions (taper angle) is defined as an angle formed by a substrate surface (horizontal surface) and slope portions of the tapered portions. A taper angle of the second conductive layer 17a can be set so as to fall within a range of 5° to 45° by appropriately selecting etching conditions.

Figure 2C:
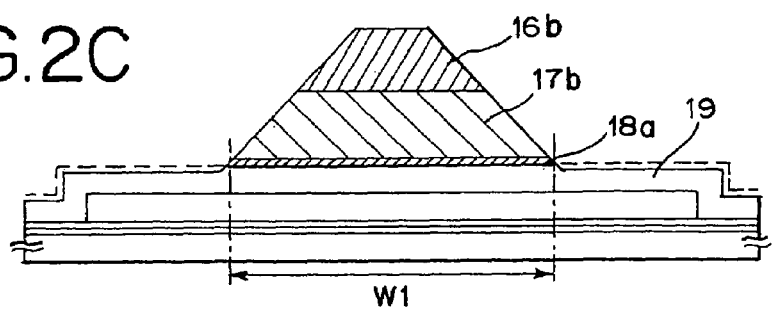

Then, the resist mask 16a is used as it is, whereby second etching is conducted by using an ICP etching apparatus. During the second etching process, the first conductive film 14 is etched to form a first conductive layer 18a as shown in FIG. 2C. The first conductive layer 18a has a first width (W1). During the second etching process, the resist mask, the second conductive layer, and the insulating film are slightly etched to form a resist mask 16b, a second conductive layer 17b, and an insulating film 19.

Figure 3A:
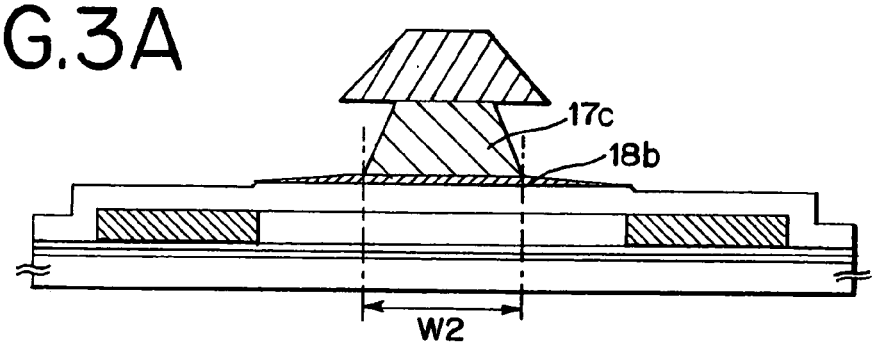
FIGS. 3A to 3D illustrate manufacturing processes according to the present invention.
Figure 3B:
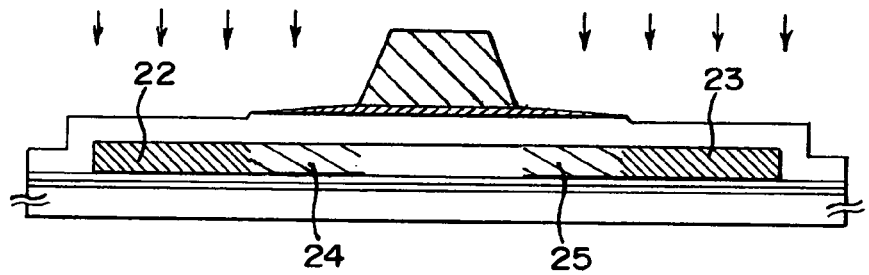
Figure 3C:
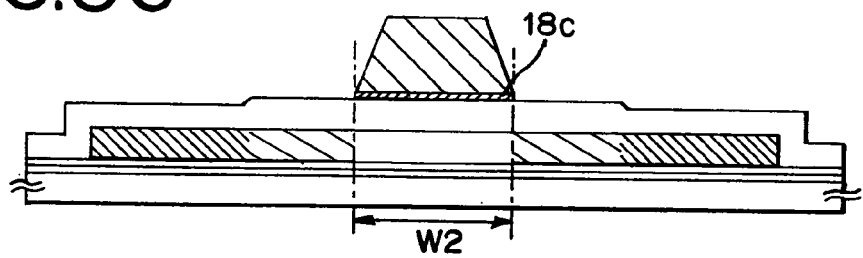

Herein, in order to suppress a decrease in the thickness of the insulating film 13, etching is conducted twice (first etching process and second etching process). However, there is no particular limit thereto as long as an electrode structure (a layered structure of the second conductive layer 17b and the first conductive layer 18a) as shown in FIG. 3C can be obtained, and etching may be conducted once.

Figure 2D:
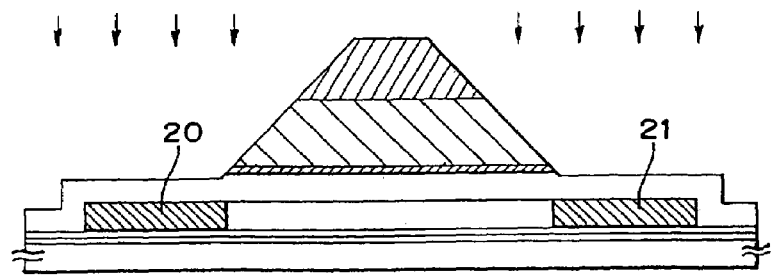

Then, first doping is conducted while the resist mask 16b is kept as it is. During the first doping process, through-doping is conducted via the insulating film 19, whereby high-concentration impurity regions 20 and 21 are formed (FIG. 2D).

Figure 32:
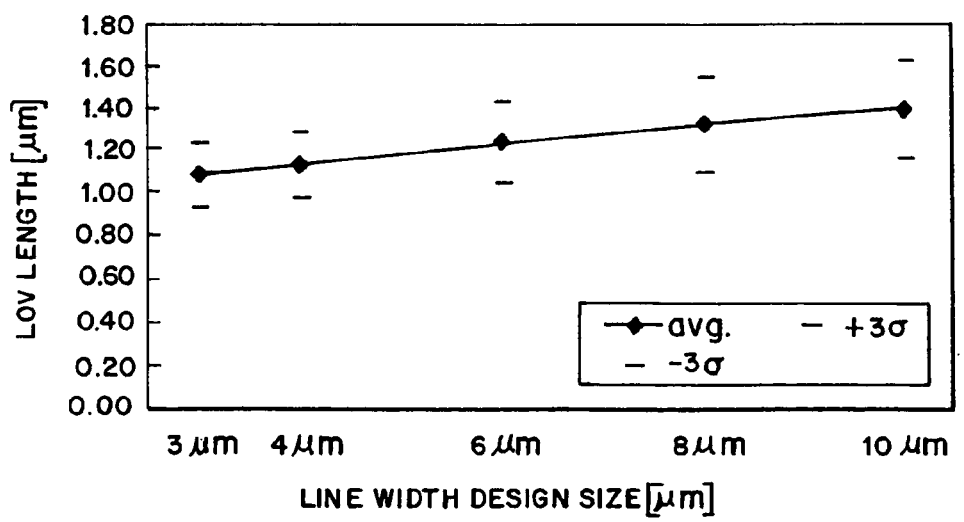
FIG. 32 shows a relationship between the line width design size and the Lov length of Embodiment 8.

Then, third etching is conducted with the resist mask 16b by using an ICP etching apparatus. During the third etching process, the second conductive layer 17b is etched to form a second conductive layer 17c as shown in FIG. 3A. The second conductive layer 17c has a second width (W2). During the third etching process, the first conductive layer is also slightly etched, and a first conductive layer 18b with a smaller width is formed. Note, as shown in FIG. 32, according to the width of wiring (here, the width W1 of the first conductive layer), the length of the taper portion of the first conductive layer varies. Therefore, when a plurality of wirings with different widths are formed, the widths of the first conductive layer 18b are differently formed.

After the resist mask 16b is removed, second doping is conducted. During the second doping process, through-doping is conducted via the taper portions of the first conductive layer 18b and the insulating film 19, whereby low-concentration impurity regions 24 and 25 are formed (FIG. 3B). During the doping process in FIG. 3B, by allowing impurity elements to pass through the taper portions, the low-concentration impurity regions 24 and 25 are formed in which an impurity concentration (P concentration) is continuously increased from a channel forming region side to the high-concentration impurity region side. During the second doping process, the high-concentration impurity regions are also doped, whereby high-concentration impurity regions 22 and 23 are formed. Herein, the high-concentration impurity regions and the low-concentration impurity regions are shown separately in the figure. However, actually, there is no clear border (boundary) therebetween, and regions having a concentration gradient as shown in FIG. 1A is formed. Similarly, there is no clear border between the channel forming region and the low-concentration impurity regions. As shown in FIG. 32, depending on the width of wiring to be designed, the length of the taper portion of the first conductive layer changes. Accordingly, in a case that a plurality of wirings with different widths are formed, the widths of the doped regions (the regions having the concentration gradient) also change.

Note, here is shown an example that the first and second etching process, and then, the first doping are performed. After that, the third etching and the second doping are carried out. However, if the electrode structure (a lamination of the second and first conductive layers) and the region having concentration gradient as shown in FIG. 3B can be formed, the process order is not limited. For example, it is possible that the electrode structure as shown in FIG. 3B is obtained through the first, second and third etching, and then the first and second doping are subsequently carried out.

Then, fourth etching is conducted using an ICP etching apparatus. During the fourth etching process, only the taper portions of the first conductive layer 18b are removed. The first conductive layer 18b having the first width (W1) becomes a first conductive layer 18c having a second width (W2). According to the present invention, the first conductive layer 18c and the second conductive layer 17c layered thereon become a gate electrode.

Thereafter, the impurity elements added to the semiconductor layer are activated. Due to the activation, the impurity elements contained in the impurity region are diffused, whereby a concentration gradient with a smoother curve is formed, and borders between the respective regions are eliminated. Then, an interlayer insulating film 27 is formed, and thereafter, contact holes are formed by using a third mask. Electrodes 28 and 29 are formed by using a fourth mask.

Figure 3D:
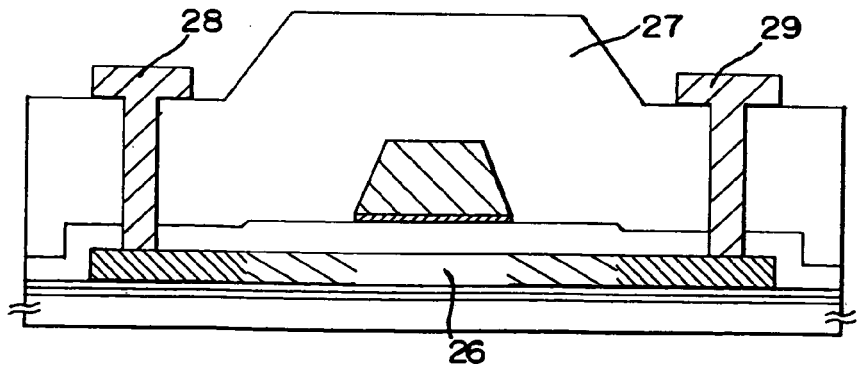

Thus, a TFT with a structure shown in FIG. 3D can be formed by using four photomasks.

The TFT formed according to the present invention is characterized in that the low-concentration impurity region 25 provided between the channel forming region 26 and the drain region 23 has a concentration gradient in which an impurity concentration is continuously increased as a distance from a channel forming region is increased, and the low-concentration impurity region 25 is not overlapped with the gate electrode.

Simulation was conducted in order to check the effect of the impurity region having a concentration gradient. Herein, assuming that there are a high-concentration impurity region that is a source/drain region, a low-concentration impurity region, and a channel forming region as shown in FIG. 4, simulation was conducted in the case where only the low-concentration impurity region has a concentration gradient. Each numerical value used for simulation was L=6 μm, W=4 μm, width of the low-concentration impurity region (Loff) =1.5 μm, thickness of a gate insulating film=115 nm, thickness of a polysilicon layer=45 nm, carrier density (B concentration) of the channel forming region=$2\times10^{16}/cm^3$, and carrier density (P concentration) of the source region/drain region (P concentration)=$1\times10^{19}/cm^3$. Furthermore, the low-concentration impurity region with a concentration gradient was compared with the low-concentration impurity region with a constant concentration (a comparative example). Herein, simulation was conducted by using a gradient of a normal distribution (Gaussian distribution) as shown in FIG. 4 as a concentration distribution model of the low-concentration impurity region, whereby voltage/current characteristics of TFTs (FIG. 5) were obtained. As a comparative example, a carrier concentration (P concentration) was kept constant ($3\times10^{17}/cm^3$, $5\times10^{17}/cm^3$) in the low-concentration impurity region, and voltage/current characteristics of TFTs were also obtained.

FIG. 5 shows voltage/current characteristics at Vds (voltage difference between the source region and the drain region)=14 V. As shown in FIG. 5, an OFF current value of the TFT having the low-concentration region with a concentration gradient was remarkably decreased, compared with the comparative examples. This is considered to be caused mainly by alleviated concentration of an electric field formed on a border of each region according to the present invention. An ON current value is determined by mobility and a sheet resistance. FIG. 5 also shows that an ON current value of the TFT having the low-concentration impurity region with a concentration gradient is the same level as that of the comparative examples. More specifically, in the case where a sheet resistance is measured in the low-concentration impurity region, even if the sheet resistance of the present invention is the same as that of the comparative example (ON current value is also the same), only an OFF current value can be reduced according to the present invention. Therefore, a ratio of an ON current value to an OFF current value is increased. In the prior art, an ON current value is also decreased when an OFF current value is designed to be decreased, so that a ratio of an ON current value to an OFF current value is hardly changed or decreased.

Herein, a gradient of a normal distribution (Gaussian distribution) was used. However, the present invention is not particularly limited thereto as long as a concentration gradient is provided. A concentration distribution may be an exponential distribution, and may form a straight line having a tilt. In any case, results obtained by simulation were substantially the same, and an OFF current was reduced when the impurity region has a continuous concentration gradient.

Figure 1B:
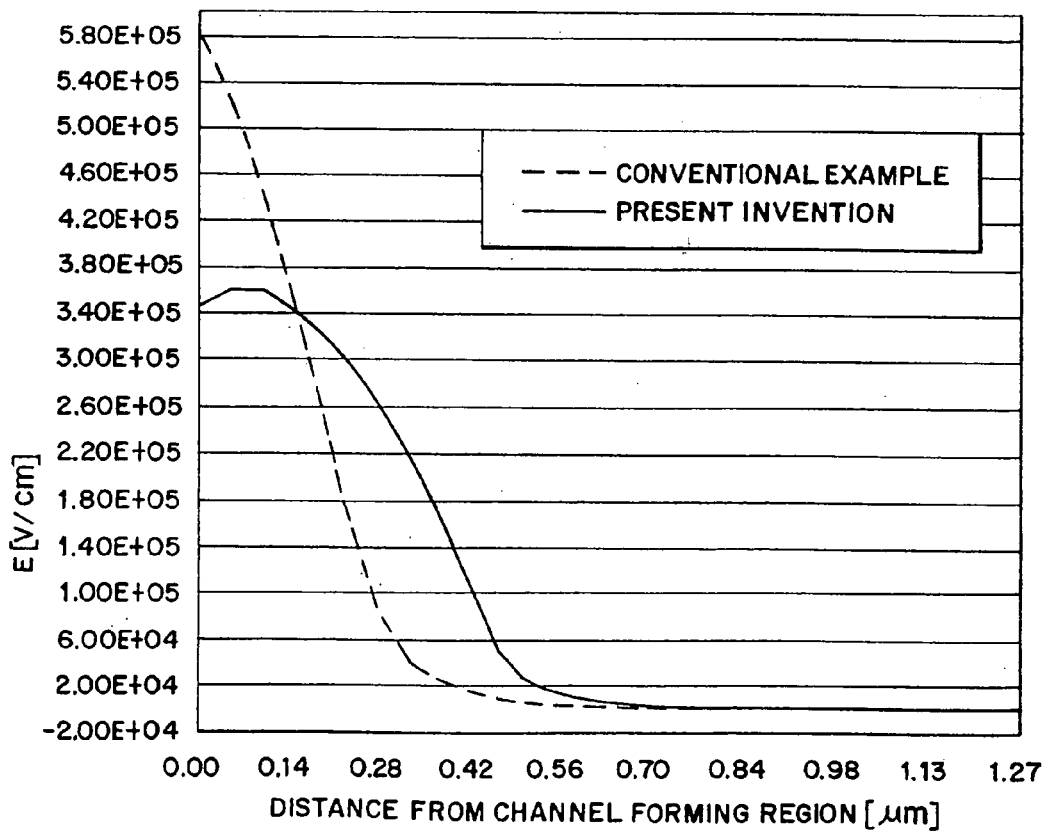

Furthermore, according to the present invention, the impurity region may have a concentration gradient as shown in FIG. 1. The present invention is not limited to a top gate type TFT structure shown in FIG. 1, and is applicable to, for example, a bottom gate type (inverted stagger type) TFT or a forward stagger type TFT.

Hereinafter, the present invention having the above-mentioned constitution will be described in more detail by way of illustrative embodiments.

Embodiment 1

In this embodiment, a method of simultaneously manufacturing a pixel portion and TFTs (n-channel TFT and p-channel TFT) of a driving circuit provided on the periphery of the pixel portion on the same substrate will be described with reference to FIGS. 6A to 6C, 7A–7C and 8.

In this embodiment, a substrate 200 is used, which is made of barium borosilicate glass such as #7059 glass and #1737 glass produced by Corning Corp. or aluminoborosilicate glass. As the substrate 200, any substrate can be used as long as it has transparency. A quartz substrate may be used. A plastic substrate having heat resistance enduring a treatment temperature of this embodiment also may be used.

Then, an underlying film 201 composed of an insulating film such as a silicon oxide film, a silicon nitride film, or a silicon oxide nitride film is formed on the substrate 200. In this embodiment, a two-layered structure is used as the underlying film 201. However, a single insulating film or a lamination of two or more insulating films using the above insulating film may also be used. As a first layer of the underlying film 201, a silicon oxide nitride film 201*a* is formed to a thickness of 10 to 200 nm (preferably, 50 to 100 nm) by plasma CVD, using $SiH_4$, $NH_3$, and $N_2O$ as reactive gas. In this embodiment, a silicon oxide nitride film 201*a* (composition ratio: Si=32%, O=27%, N=24%, and H=17%) having a thickness of 50 nm is formed. Then, as a second layer of underlying film 201, a silicon oxide nitride film 201*b* is formed to a thickness of 50 to 200 nm (preferably, 100 to 150 nm) by plasma CVD, using $SiH_4$ and $N_2O$ as reactive gas. In this embodiment, a silicon oxide nitride film (composition ratio: Si=32%, O=59%, N=7%, and H=2%) having a thickness of 100 nm is formed.

Then, semiconductor layers 202 to 206 are formed on the underlying film 201. The semiconductor layers 202 to 206 are formed by forming a semiconductor film having an amorphous structure by a known method (sputtering, LPCVD, plasma CVD, or the like), conducting a known crystallization precessing (laser crystallization, thermal crystallization, or thermal crystallization using a catalyst such as nickel) to obtain a crystalline semiconductor film, and patterning the film into a desired shape. The semiconductor layers 202 to 206 are formed to a thickness of 25 to 80 nm (preferably, 30 to 60 nm). There is no particular limit regarding the material for the crystalline semiconductor film. However, it is preferable to form the crystalline semiconductor film of silicon or a silicon germanium ($Si_xGe_{1-x}$ X=0.0001 to 0.02) alloy. In this embodiment, an amorphous silicon film of 55 nm is formed by plasma CVD, and thereafter, a solution containing nickel is held on the amorphous silicon film. The amorphous silicon film is dehydrogenated (at 500° C., for one hour), and then subjected to thermal crystallization (at 550° C., tor 4 hours). Furthermore, laser annealing is conducted for the purpose of improving crystallization, whereby a crystalline silicon film is formed. The crystalline silicon film is subjected to patterning by photolithography to form the semiconductor layers 202 to 206.

Furthermore, after the semiconductor layers 202 to 206 are formed, doping of a trace amount of impurity elements (boron or phosphorus) may be appropriately conducted so as to control a threshold value of TFTs.

Furthermore, in the case of manufacturing a crystalline semiconductor film by laser crystallization, a pulse-oscillation type or continuous light emission type excimer laser, a YAG laser, a $YVO_4$ laser, a YLF laser, a $YAlO_3$ laser, a glass laser, a ruby laser, an alexandrite laser or a Ti:sapphire laser can be used. When using these lasers, laser light emitted from a laser oscillator may be condensed into a line shape by an optical system and allowed to radiate to a semiconductor film. Crystallization conditions are appropriately selected by the operator. However, when using a pulse oscillation excimer laser, a pulse oscillation frequency is set to be 30 Hz, and a laser energy density is set to be 100 to 400 mJ/cm$^2$ (typically 200 to 300 mJ/cm$^2$). In the case of using a pulse oscillation YAG laser or a YVO$_4$ laser, the second or third harmonic thereof may be used, a pulse oscillation frequency may be set to be 1 to 10 kHz, and a laser energy density may be set to be 300 to 600 mj/cm$^2$ (typically, 350 to 500 mJ/cm$^2$). Laser light condensed in a line shape with a width of 100 to 1000 μm (e.g., 400 μm) may be radiated over the entire surface of a substrate, and a line-shaped laser light overlap ratio at this time may be set to be 80 to 98%.

Further, when a continuous oscillation (continuous wave) laser such as the YVO$_4$ laser, a laser light emitted from the continuous oscillation YVO$_4$ laser with an output of 10 W is converted to a harmonic (the second through fourth harmonic) by a non-linear optical element. Otherwise, there is a way to emit the harmonic in which a YVO$_4$ crystal and the non-linear optical element are located in a oscillator. It is preferable to shape a rectangular or elliptical laser light at an irradiation surface by an optical system. Then, the laser light is irradiated to an object to be processed. In this time, an energy density 0.01–100 MW/cm$^2$ (preferably, 0.1–10 MW/cm$^2$) is needed. The semiconductor film is moved at a speed of 0.5–2000 cm/s relative to the laser light.

Then, a gate insulating film 207 is formed so as to cover the semiconductor layers 202 to 206. The gate insulating film 207 is formed of an insulating film containing silicon so as to have a thickness of 40 to 150 nm by plasma CVD or sputtering. In this embodiment, a silicon oxide nitride film (composition ratio: Si=32%, O=59%, N=7%, and H=2%) is formed to a thickness of 115 nm by plasma CVD. Needless to say, the gate insulating film is not limited to a silicon oxide nitride film, and may have a single layer or multi-layered structure of insulating films containing silicon.

Then, as shown in FIG. 6A, a first conductive film 208 (thickness: 20 to 100 nm) and a second conductive film 209 (thickness: 100 to 400 nm) are laminated on the gate insulating film 207. In this embodiment, the first conductive film 208 made of a TaN film having a thickness of 30 nm and the second conductive film 209 made of a W film having a thickness of 370 nm are laminated thereon. The TaN film is formed by sputtering using Ta as a target in an atmosphere containing nitrogen. The W film is formed by sputtering using W as a target. The W film can also be formed by thermal CVD using tungsten hexafluoride (WF$_6$). In any case, it is required to lower a resistance in order to use the W film as a gate electrode, and it is desirable that a resistance ratio of the W film is 20 μΩcm or less. The resistance ratio of the W film can be lowered by enlarging crystal grains thereof. However, in the case where there are a number of impurity elements such as oxygen in the W film, crystallization is inhibited, and the resistance of the W film is increased. Therefore, in this embodiment, the W film is formed by sputtering using high-purity W (purity: 99.9999%) as a target so that no impurity may be allowed to enter in the W film from a vapor phase during the film formation, whereby a resistance ratio of 9 to 20 μΩcm can be achieved.

In this embodiment, the first conductive film 208 is made of TaN, and the second conductive film 209 is made of W. However, the present invention is not limited thereto. Both the films may be formed of an element selected from Ta, W, Ti, Mo, Al, Cu, Cr, and Nd, or an alloy material containing the element as its main component or a compound material. A semiconductor film such as a polycrystalline silicon film doped with an impurity element such as phosphorus may also be used. Furthermore, an AgPdCu alloy may be used. Furthermore, the following combination may be used: the first conductive film made of a tantalum (Ta) film and the second conductive film made of a W film; the first conductive film made of a titanium nitride (TiN) film and the second conductive film made of a W film; the first conductive film made of a tantalum nitride (TaN) film and the second conductive film made of an Al film; the first conductive film made of tantalum nitride (TaN) film and the second conductive film made of a Cu film.

Then, masks 210 to 215 made of a resist are formed by photolithography, and first etching processing for forming electrodes and wiring is conducted. The first etching processing is conducted as first and second etching conditions. In this embodiment, under the first etching condition, etching is conducted by an inductively coupled plasma (ICP) etching method, in which plasma is generated by using CF$_4$, Cl$_2$, and O$_2$ as etching gas (flow rate: 25/25/10 (sccm)) with an RF power (13.56 MHz) of 500 W supplied to a coil-shaped electrode at a pressure of 1 Pa. As the etching gas, chlorine type gas such as Cl$_2$, BCl$_3$, SiCl$_4$, and CCl$_4$ or fluorine gas such as CF$_4$, SF$_6$, and NF$_3$, or O$_2$ can be appropriately used. Herein, a dry etching apparatus (Model E645-ICP) using ICP produced by Matsushita electric Industrial Co., Ltd. is used. An RF power (13.56 MHz) of 150 W is also applied to the substrate side (sample stage), whereby a substantially negative self-bias voltage is applied thereto. An area of an electrode on the substrate side is 12.5 cm×12.5 cm, and a coil-shaped electrode (herein, a quartz disk provided with a coil) has a diameter of 25 cm. Under the first etching condition, the W film is etched and end portions of the first conductive layer are tapered. Under the first etching condition, an etching rate with respect to W is 200.39 nm/min., an etching rate with respect to TaN is 80.32 nm/min., and a selection ratio of W with respect to TaN is about 2.5. Furthermore, under the first etching condition, a taper angle of W becomes about 26°. The etching under the first etching condition corresponds to the first etching process (FIG. 2B) described in the embodiment mode.

Thereafter, without removing the masks 210 to 215 made of a resist, etching is conducted for about 30 seconds under the second etching condition, in which plasma is generated by using CF$_4$ and Cl$_2$ as etching gas (flow rate ratio: 30/30 (sccm)) with an RF power (13.56 MHz) of 500 W supplied to a coil-shaped electrode at a pressure of 1 Pa. An RF power (13.56 MHz) of 20 W is also applied to the substrate side (sample stage), whereby a substantially negative self-bias voltage is applied thereto. Under the second etching condition using a mixture of CF$_4$ and Cl$_2$ as etching gas, the W film and the TaN film are etched to the same degree. Under the second etching condition, an etching rate with respect to W is 58.97 nm/min., and an etching rate with respect to TaN is 66.43 nm/min. In order to conduct etching without leaving any residual on the gate insulating film, an etching time may be increased by about 10 to 20%. The etching under the second etching condition corresponds to the second etching process (FIG. 2C) described in the embodiment.

According to the first etching processing, by appropriately prescribing the shape of a resist mask, the end portions of the first conductive layer and the second conductive layer are tapered due to the effect of a bias voltage applied to the substrate side. The angle of the taper portion may be 15° to 45°.

Furthermore, the angle of the taper portion (taper angle) may be appropriately determined by the operator with reference to Table 1.

TABLE 1

Etching rate (E.R.) of W and TaN and taper angle of W

| Condition | ICP [W] | Bias [W] | Voltage [Pa] | CF$_4$ [sccm] | Cl$_2$ [sccm] | O$_2$ [sccm] | W E. R. (1) [nm/min] | TaN E. R. (2) [nm/min] | W/TaN selection ratio (1) ÷ (2) | Taper angle of W [deg] |
|---|---|---|---|---|---|---|---|---|---|---|
| 1 | 500 | 20 | 1.0 | 30 | 30 | 0 | 58.97 | 66.43 | 0.889 | 80 |
| 2 | 500 | 60 | 1.0 | 30 | 30 | 0 | 88.71 | 118.46 | 0.750 | 25 |
| 3 | 500 | 100 | 1.0 | 30 | 30 | 0 | 111.66 | 168.03 | 0.667 | 18 |
| 4 | 500 | 20 | 1.0 | 25 | 25 | 10 | 124.62 | 20.67 | 6.049 | 70 |
| 5 | 500 | 60 | 1.0 | 25 | 25 | 10 | 161.72 | 35.81 | 4.528 | 35 |
| 6 | 500 | 100 | 1.0 | 25 | 25 | 10 | 176.90 | 56.32 | 3.008 | 32 |
| 7 | 500 | 150 | 1.0 | 25 | 25 | 10 | 200.39 | 80.32 | 2.495 | 26 |
| 8 | 500 | 200 | 1.0 | 25 | 25 | 10 | 218.20 | 102.87 | 2.124 | 22 |
| 9 | 500 | 250 | 1.0 | 25 | 25 | 10 | 232.12 | 124.97 | 1.860 | 19 |
| 10 | 500 | 20 | 1.0 | 20 | 20 | 20 | —(*) | 14.83 | — | — |
| 11 | 500 | 60 | 1.0 | 20 | 20 | 20 | 193.02 | 14.23 | 13.695 | 37 |
| 12 | 500 | 100 | 1.0 | 20 | 20 | 20 | 235.27 | 21.81 | 10.856 | 29 |
| 13 | 500 | 150 | 1.0 | 20 | 20 | 20 | 276.74 | 38.61 | 7.219 | 26 |
| 14 | 500 | 200 | 1.0 | 20 | 20 | 20 | 290.10 | 45.30 | 6.422 | 24 |
| 15 | 500 | 250 | 1.0 | 20 | 20 | 20 | 304.34 | 50.25 | 6.091 | 22 |

(*)"—"represents impossibility of measurement due to a change of a W surface during etching Thus, conductive layers 216 to 221 of a first shape composed of first conductive layers 216a to 221a and second conductive layers 216b to 221b are formed by the first etching processing. The width of the first conductive layer in the channel length direction corresponds to W1 shown in the above embodiment mode. Although not shown, regions of the insulating film 207 to be a gate insulating film, not covered with the conductive layers 216 to 221 of a first shape, are etched by about 10 to 20 nm to be thin.

Without removing the resist masks, first doping processing is conducted, whereby an impurity element providing an n-type is added to the semiconductor layers (FIG. 6B). The doping processing may be conducted by ion doping or ion implantation. Ion doping is conducted under the conditions of a dose amount of $1\times10^{13}$ to $5\times10^{15}/cm^2$ and an acceleration voltage of 60 to 100 keV. In this embodiment, doping is conducted at a dose amount of $1.5\times10^{15}/cm^2$ and an acceleration voltage of 80 keV. As the impurity element providing an n-type, an element belonging to Group XV, typically, phosphorus (P) or arsenic (As) is used. Herein, phosphorus (P) is used. In this case, the conductive layers 216 to 221 function as masks with respect to the impurity element providing an n-type, whereby high-concentration impurity regions 222 to 233 are formed in a self-alignment manner. An impurity element imparting an n-type is added to the high-concentration impurity regions 222 to 223 in a concentration of $1\times10^{20}$ to $1\times10^{21}/cm^3$. The first doping processing corresponds to the first doping process (FIG. 2D) described in the embodiment mode.

Then, without removing the resist masks, second etching processing is conducted. Herein, etching is conducted for 25 seconds by using SF$_6$, Cl$_2$, and O$_2$ as etching gas (flow rate ratio: 24/12/24 (sccm)) with an RF power (13.56 MHz) of 700 W supplied to a coil-shaped electrode at a pressure of 1.3 Pa to thereby generate plasma. An RF power (13.56 MHz) of 10 W is also applied to the substrate side (sample stage), whereby a substantially negative self-bias voltage is applied thereto. In the second etching processing, an etching rate with respect to W is 227.3 nm/min., an etching rate with respect to TaN is 32.1 nm/min., and a selection ratio of W with respect to TaN is 7.1. An etching rate with respect to SiON that is the insulating film 207 is 33.7 nm/min., and a selection ratio of W with respect to TaN is 6.83. In the case of using SF$_6$ as the etching gas, a selection ratio with respect to the insulating film 207 is high, so that a decrease in a film thickness can be suppressed. Furthermore, in a TFT of a driving circuit, reliability becomes higher as the width of the taper portion in the channel length direction is longer. Therefore, when the taper portion is formed, it is effective to conduct dry etching with etching gas containing SF$_6$.

The taper angle of W becomes 70° in the second etching processing. Furthermore, in the second etching processing, second conductive layers 234b to 239b are formed. On the other hand, the first conductive layers are hardly etched to form first conductive layers 234a to 239a. Although not shown, actually, the width of the first conductive layers is narrowed by about 0.15 μm (i.e., about 0.3 μm over the total line width) compared with the state before the second etching processing. The second etching processing corresponds to the third etching process (FIG. 3A) described in the embodiment. Furthermore, the width of the second conductive layer in the channel length direction corresponds to W2 shown in the embodiment mode.

It is also possible to use CF$_4$, Cl$_2$, and O$_2$ as the etching gas in the second etching processing. In this case, etching may be conducted by generating plasma under a flow rate ratio of 25/25/10 (sccm) with an RF power (13.56 MHz) of 500 W supplied to a coil-shaped electrode at a pressure of 1 Pa. An RF power (13.56 MHz) of 20 W is also applied to the substrate side (sample stage), whereby a substantially negative self bias voltage is applied thereto. In the case of using CF$_4$, Cl$_2$, and O$_2$, an etching rate with respect to W is 124.62 nm/min., an etching rate with respect to TaN is 20.67 nm/min., and a selection ratio of W with respect to TaN is 6.05. Thus, the W film is selectively etched. Furthermore, in this case, the regions of the insulating film 207, not covered with the conductive layers 234 to 239 of a first shape, are etched by about 50 nm to be thin.

Then, after removing the resist masks, second doping processing is conducted to obtain a state shown in FIG. 6C. In addition, although the widths of the taper portions of the first conductive layer are shown as identical in FIG. 6C, the lengths of the taper portions of the first conductive layers vary according to the widths of wiring as shown in FIG. 32. Therefore, in a case that a plurality of wirings with different widths are formed over one substrate, the widths of the doped regions also change. Doping is conducted using the second conductive layers 234b to 239b as masks with respect to an impurity element so that the impurity element is added to the semiconductor layers below the taper portions of the first conductive layers. In this embodiment, phosphorus (P) is used as the impurity element, and plasma doping is conducted under the doping conditions of a dose amount of $1.5 \times 10^{14}$/cm$^2$, an acceleration voltage of 90 keV, an ion current density of 0.5 µA/cm$^2$, phosphine (PH$_3$) 5% hydrogen dilute gas, and a flow rate of 30 sccm. Thus, low-concentration impurity regions 241 to 254 are formed so as to be overlapped with the first conductive layers in a self-alignment manner. The concentration of phosphorus (P) added to the low-concentration impurity regions 241 to 254 is $1 \times 10^{17}$ to $1 \times 10^{19}$/cm$^2$, and the low-concentration impurity regions 241 to 254 have a concentration gradient in accordance with the thickness of the taper portions of the first conductive layers. In the semiconductor layer overlapped with the taper portion of the first conductive layer, an impurity concentration (P concentration) decreases gradually from the end of the taper portion of the first conductive layer inwardly. More specifically, in the second doping processing, a concentration distribution in FIG. 1A described in embodiment mode is formed. Furthermore, an impurity element is also added to the high-concentration impurity regions 222 to 233 to form high-concentration impurity regions 255 to 266. The second doping processing corresponds to the second doping process (FIG. 3B) described in the embodiment.

Figure 23:
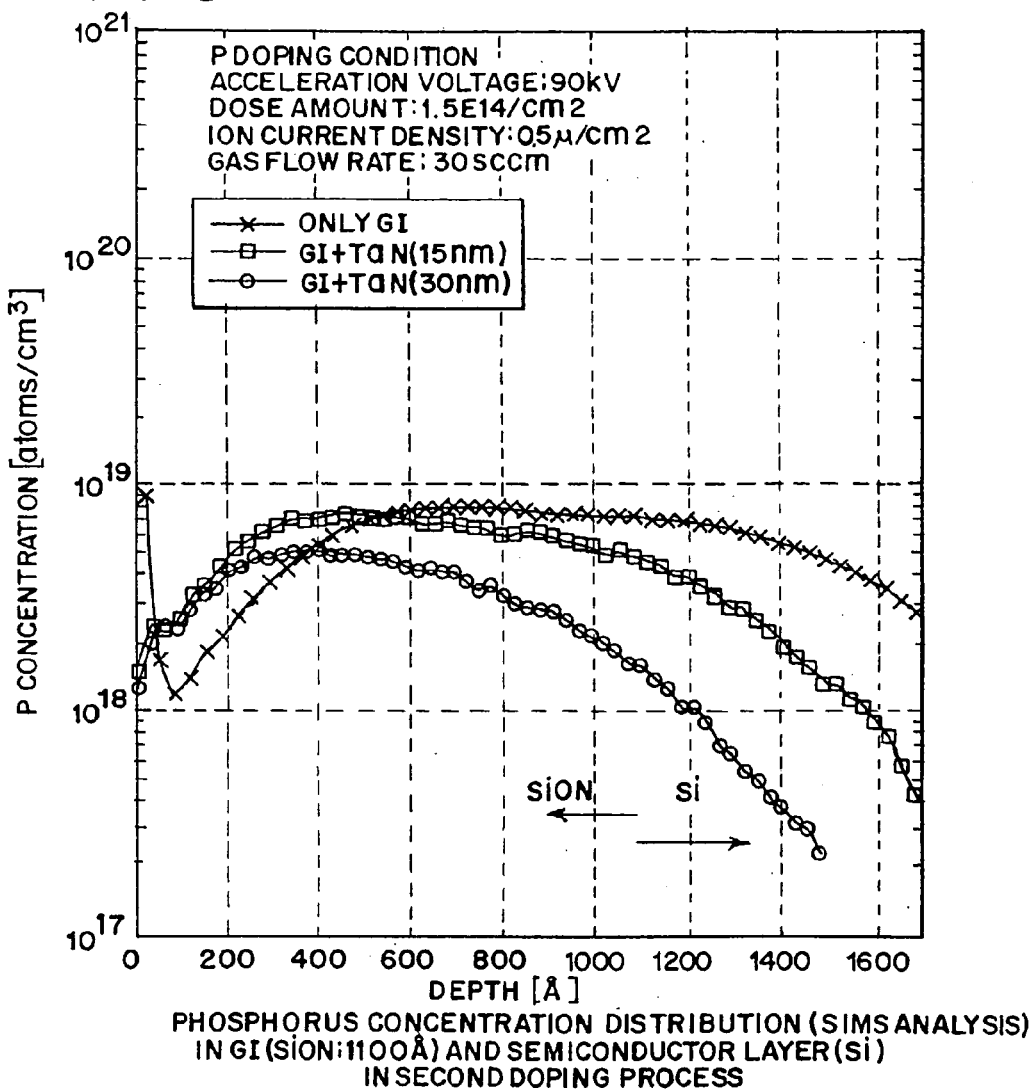
FIG. 23 is a graph showing an impurity concentration distribution in a depth direction by second doping processing of Embodiment 1.

FIG. 23 shows a concentration distribution (SIMS analysis) of phosphorus in a depth direction when the second doping processing (acceleration voltage of 90 kV, and dose amount of $1.5 \times 10^{14}$/cm$^2$) is conducted. It is understood from FIG. 23 that, in the depth direction, the concentration of an impurity added to the semiconductor layers (Si) in the second doping processing decreases from the surface toward the substrate side. In FIG. 23, "x" represents a concentration distribution (depth direction) of Sample A obtained by forming a silicon oxide nitride film to a thickness of 110 nm on a silicon substrate, followed by a second doping. The concentration distribution of Sample A corresponds to a concentration distribution of the regions not covered with the first conductive layers in FIG. 6C.

In FIG. 23, "□" represents a concentration distribution (depth direction) of Sample B obtained by forming a TaN film to a thickness of 15 nm on the gate insulating film (silicon oxide nitride film), followed by the second doping. The concentration distribution of Sample B corresponds to a concentration distribution of regions of the first conductive layers where the thickness of the taper portions is 15 nm. A value of a depth in the horizontal axis does not include a thickness of a TaN film.

In FIG. 23, "○" represents a concentration distribution (depth direction) of Sample C obtained by forming a TaN film to a thickness of 30 nm on a silicon oxide nitride-film, followed by the second doping. The concentration distribution of Sample C corresponds to a concentration distribution of regions of the first conductive layers where the thickness of the taper portions is 30 nm in FIG. 6C. A value of a depth in the horizontal axis does not include a thickness of a TaN film.

It is understood from FIG. 23 that, in the vicinity of the surfaces of the semiconductor layers (in the vicinity of the interfaces between the semiconductor layers and the gate insulating film) positioned below the taper portions, the concentration of phosphorus continuously increases in a range of $1 \times 10^{18}$ to $7 \times 10^{18}$/cm$^3$ as the thickness of the taper portion decreases from 30 nm to 0 nm (i.e., with distance from the channel forming region in the channel length direction).

It is also understood from FIG. 23 that, at a position of 40 nm from the surface of the semiconductor layer positioned below the taper portion, a phosphorus concentration is continuously increased in a range of $1.5 \times 10^{17}$ to $3.5 \times 10^{18}$/cm$^3$ as the thickness of the taper portion decreases from 30 nm to 0 nm (i.e., with distance from the channel forming region in the channel length direction). It should be noted that the phosphorus concentration by SIMS analysis is measured immediately after doping. Phosphorus is dispersed later by heat treatment or the like, so that the phosphorus concentration by SIMS analysis is slightly different from that at the completion of a TFT.

In this embodiment, the width (in the channel length direction) of the taper portion is preferably at least 0.5 µm or more up to a range of 1.5 µm to 2 µm. Therefore, although influenced by a thickness, the width in the channel length direction of the low-concentration impurity region having a concentration gradient is not beyond a range of 1.5 µm to 2 µm, either. Herein, although the high-concentration impurity regions and the low-concentration impurity regions are shown separately. Actually, there is no clear border therebetween. As shown in FIG. 1A, regions having a concentration gradient are formed. Similarly, there is no clear border between the channel forming regions and the low-concentration impurity regions.

Next, the semiconductor layers to be active layers of n-channel TFTs are covered with resist masks 267 to 269. Under this condition, third doping processing is conducted. In the third doping processing, p-type impurity regions 270 to 273 (high-concentration impurity regions 270a to 273a and low-concentration impurity regions 270b to 273b) are formed in which an impurity element providing conductivity (p-type) opposite to the above-mentioned conductivity (n-type) is added to the semiconductor layers to be active layers of p-channel TFTs. Since the semiconductor layers are doped with the impurity element by allowing the impurity element to pass through the taper portions, the p-type low-concentration impurity regions 270b to 273b have a concentration gradient similar to that of the n-type low-concentration impurity regions 241 to 254 (FIG. 7A). Using the first conductive layers 234a and 236b as masks with respect to an impurity element, an impurity element providing a p-type is added to form p-type impurity regions. In this embodiment, the p-type impurity regions 270 to 273 are formed by ion doping using diborane (B$_2$H$_6$). In the first and second doping processing, phosphorus is added to the impurity regions 270a to 273a in different concentrations. However, by conducting doping processing so that the concentration of boron becomes $2 \times 10^{20}$ to $2 \times 10^{21}$/cm$^3$ in either region, whereby they function as a source region and a drain region of a p-channel TFT. Thus, there is not problem.

Furthermore, in the case of using the condition of preventing a decrease in film thickness in the second etching processing (for example, in the case of using SF$_6$ as etching gas), in order to facilitate doping of boron, etching (reactive ion etching (RIE) using CHF$_3$ gas) for thinning the insulating film 207 may be conducted before the third doping processing.

Then, a resist mask 274 is formed, and third etching processing is conducted. In the third etching processing, taper portions of the first conductive layers are selectively etched to eliminate regions overlapped with the semiconductor layers. The third etching processing is conducted by using an ICP etching apparatus, using, as etching gas, $Cl_2$ having a high selection ratio with respect to W. In this embodiment, etching is conducted for 30 seconds by generating plasma, using $Cl_2$ with a flow rate ratio of 80 (sccm), with an RF power (13.56 MHz) of 350 W supplied to a coil-shaped electrode at a pressure of 1.2 Pa. An RF power (13.56 MHz) of 50 W is also supplied to the substrate side (sample stage), whereby a substantially negative self-bias voltage is applied thereto. In the third etching, first conductive layers 237c to 239c are formed (FIG. 7B). The third etching processing corresponds to the fourth etching process (FIG. 3C) described in the embodiment. Furthermore, the width of the first conductive layer in the channel length direction corresponds to W2 shown in the embodiment.

In the third etching processing, low-concentration impurity regions (LDD regions) 247 to 254 having a concentration gradient are formed so as not to be overlapped with the first conductive layers 237c to 239c. The low-concentration impurity regions (GOLD regions) 241 to 246 remain overlapped with the first conductive layers 234a to 236a. Thus, the structure of a TFT is made different in accordance with each circuit.

Furthermore, an electrode constituted by the first conductive layer 237c and the second conductive layer 237b functions as agate electrode of an n-channel TFT of a sampling circuit to be formed in the later process. Similarly, an electrode constituted by the first conductive layer 238c and the second conductive layer 238b functions as a gate electrode of an n-channel TFT in a pixel portion to be formed in the later process. An electrode constituted by the first conductive layer 239c and the second conductive layer 239b functions as one electrode of a storage capacitor in a pixel portion to be formed in the later process.

In this embodiment, the third etching processing is conducted after the third doping processing. However, the third doping processing may be conducted after the third etching processing.

Then, the resist mask 274 is removed and a first interlayer insulating film 275 is formed. The first interlayer insulating film 275 is formed to a thickness of 10 to 200 nm by plasma CVD or sputtering, using an insulating film containing silicon. The first interlayer insulating film functions as an etching stopper so that the semiconductor layers are not overetched during formation of contact holes in the insulating film that is decreased in thickness. In this embodiment, a silicon oxide film having a thickness of 50 nm is formed by plasma CVD. Needless to say, the first interlayer insulating film 275 is not limited to a silicon oxide film. A single layer or multi-layered structure of insulating films containing silicon may be used.

Then, as shown in FIG. 7C, an impurity element added to each semiconductor layer is activated. The activation is conducted by thermal annealing using an annealing furnace. Thermal annealing may be conducted at 400° C. to 700° C., typically 500° C. to 550° C. in a nitrogen atmosphere having an oxygen concentration of 1 ppm or less, preferably 0.1 ppm or less. In this embodiment, activation is conducted by heat treatment at 550° C. for four hours. Instead of thermal annealing, laser annealing or rapid thermal annealing (RTA) can be applied.

Although not shown in the figure, the impurity element is dispersed due to the activation, whereby a border between the low-concentration impurity region and the high-concentration impurity region is eliminated to obtain the concentration distribution shown in FIG. 1A. Thus, the low-concentration impurity region has a concentration gradient, and a part of the high-concentration impurity region on the side of the low-concentration impurity region also has a concentration gradient.

In this embodiment, at the same time as the above-mentioned activation, nickel used as a catalyst during crystallization is gettered in the impurity region containing phosphorus of high concentration, whereby a nickel concentration in the semiconductor layer mainly to be a channel forming region is reduced. In a TFT having a channel forming region thus produced, an OFF current value is decreased and crystallinity is satisfactory. Therefore, a high electric field effect mobility is obtained, and satisfactory characteristics can be achieved.

The activation may be conducted before forming the first interlayer insulating film. In the case where a wiring material to be used is weak to heat, it is preferable to conduct the activation after forming an interlayer insulating film (insulating film mainly containing silicon, e.g., silicon nitride film) for protecting the wiring and the like as in this embodiment.

Then, a second interlayer insulating film 276 made of a silicon nitride film is formed, followed by heat treatment (at 300° C. to 550° C., for 1 to 12 hours), whereby the semiconductor layers are hydrogenated. In this embodiment, heat treatment is conducted at 410° C. for one hour in a nitrogen atmosphere. This process is conducted for terminating a dangling bond of the semiconductor layers by hydrogen contained in the second interlayer insulating film 276. Irrespective of the presence of the first interlayer insulating film, the semiconductor layers can be hydrogenated. Plasma hydrogenation (using hydrogen excited by plasma) may be conducted.

In the case of using laser annealing as the activation, it is desirable that laser light such as excimer laser and YAG laser is radiated after the above hydrogenation.

Then, a third interlayer insulating film 277 made of an organic insulating material is formed on the second interlayer insulating film 276. In this embodiment, an acrylic resin film having a thickness of 1.6 μm is formed. Then, patterning is conducted so as to form contact holes reaching each impurity region (257, 258, 261 to 263, 265, 270a, 271a, 272a, and 273a). In this embodiment, a plurality of etching processes are conducted. In this embodiment, the third interlayer insulating film is etched using the second interlayer insulating film as an etching stopper. Then, the second interlayer insulating film is etched using the first interlayer insulating film as an etching stopper. Thereafter, the first interlayer insulating film is etched.

Then, electrodes 278 to 286 electrically connected to the impurity regions (257, 258, 261 to 263, 270a, 271a, 272a, 273a) and a pixel electrode 287 electrically connected to the impurity region 265 are formed. As materials for these electrodes and the pixel electrode, a material excellent in reflectivity such as a film mainly containing Al or Ag, or a layered film thereof is used.

As described above, a driving circuit 301 including a logic circuit portion 303 composed of an n-channel TFT 306 and a p-channel TFT 305 and a sampling circuit portion 304 composed of an n-channel TFT 308 and a p-channel TFT 307, and a pixel portion 302 including a pixel TFT formed of an n-channel TFT 309 and a storage capacitor 310 can be formed over the same substrate. In the present specification, such a substrate is referred to as an active matrix substrate for convenience.

In this embodiment, the structure of a TFT is varied depending upon each circuit.

The n-channel TFT 309 in the pixel portion 302 requires low power consumption, and it is desirable to construct a TFT structure having a sufficiently low OFF current value. In this embodiment, the low-concentration impurity regions 249 to 252 have a concentration gradient and are designed so as not to be overlapped with the gate electrodes 238b and 238c. Furthermore, the end portion of the gate electrode in the n-channel TFT 309 is substantially matched with the interface between the channel forming region and the low-concentration impurity region via the gate insulating film. Furthermore, regarding the concentration distribution of the respective low-concentration impurity regions 249 to 252, an impurity concentration is increased with distance from the channel forming regions 292 and 293.

Figure 13:
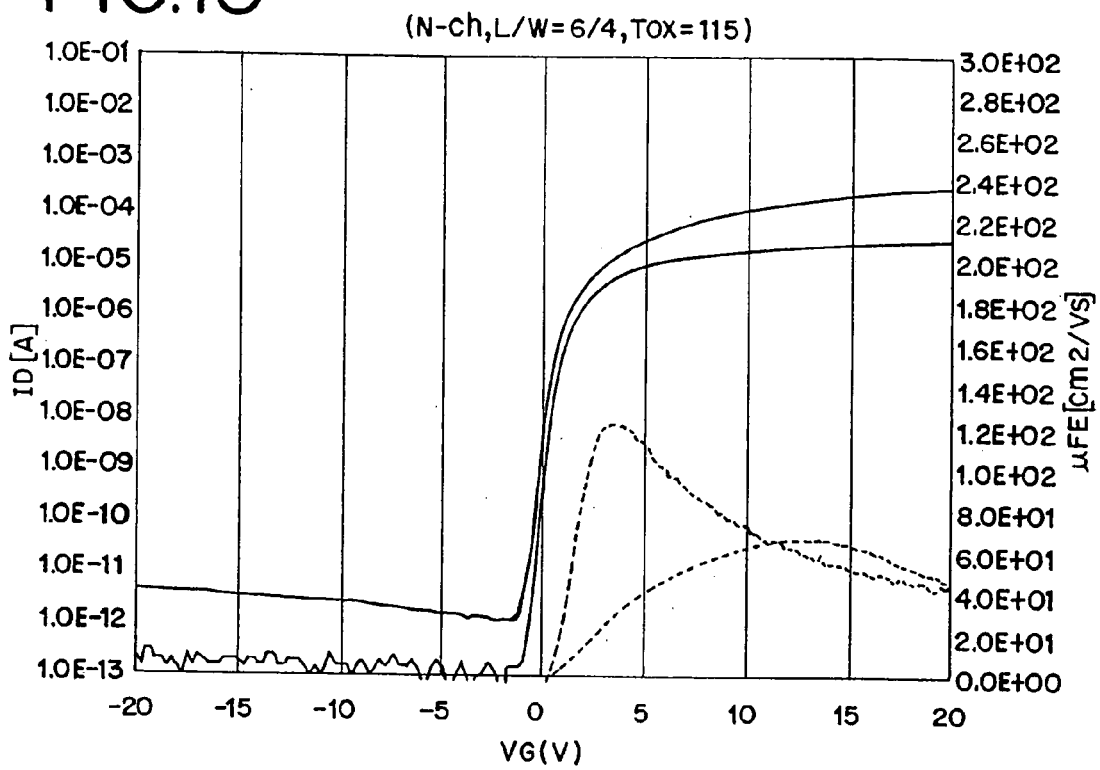
FIG. 13 shows voltage/current characteristics of a TFT in a pixel portion of Embodiment 1.
Figure 29:
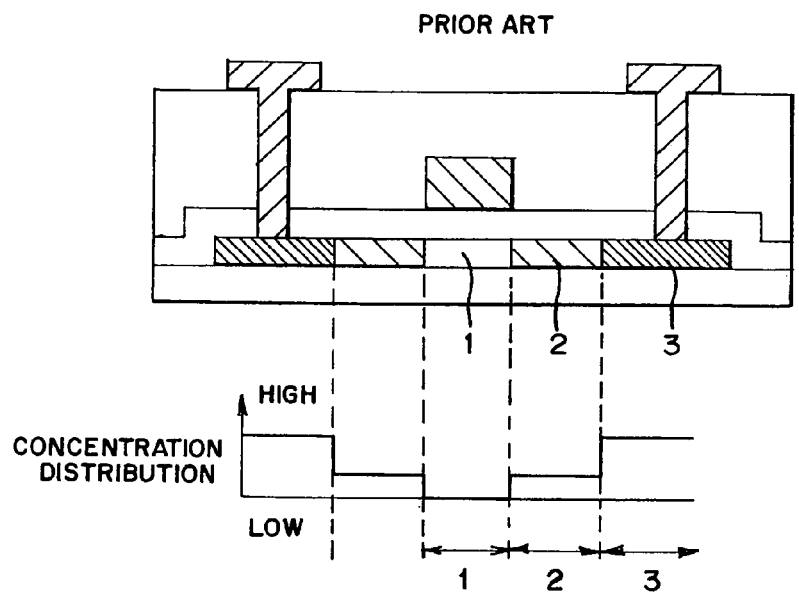
FIG. 29 shows a conventional example.
Figure 30:
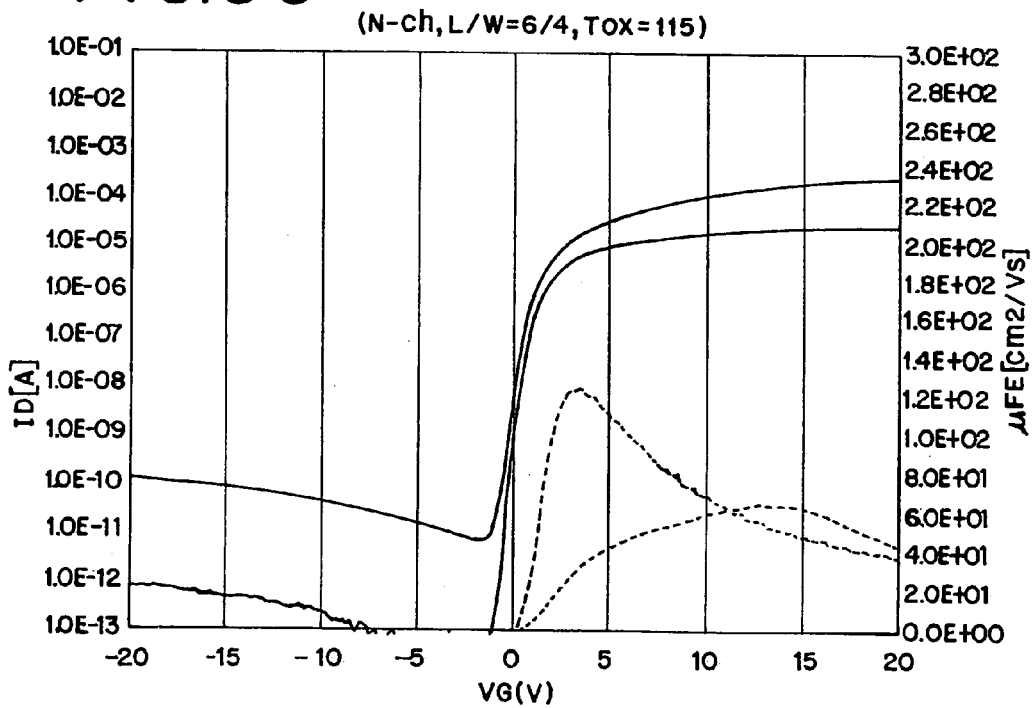
FIG. 30 is a graph showing voltage/current characteristics of a TFT in the conventional example.

FIG. 13 shows voltage/current characteristics of a TFT (L/W=6 μm/4 μm, width of an LDD region: 1.5 μm) formed by the processes of this embodiment. FIG. 30 shows voltage/current characteristics of a TFT as a comparative example. The comparative example in FIG. 30 is different from this embodiment (low-concentration impurity region having a concentration gradient) in that TFT has no concentration gradient in the low-concentration impurity region 2 as shown in FIG. 29.

In FIG. 13, a threshold value (Vth) of a TFT is 0.415 V, an S value is 0.214 V/dec, an electric field effect mobility (μFE) is 122.1 cm$^2$/Vs, an ON current value is $1.08 \times 10^{-4}$ A at Vds (voltage difference between a source region and a drain region) 14 V, and an OFF current value is $1.5 \times 10^{-12}$ A at Vds=14 V. These values represent satisfactory TFT characteristic values. In particular, an OFF current value is very low, which is suppressed to about 1/10 compared with the comparative example. Furthermore, these TFT characteristics correspond to the results of simulation shown in the embodiment.

Figure 11:
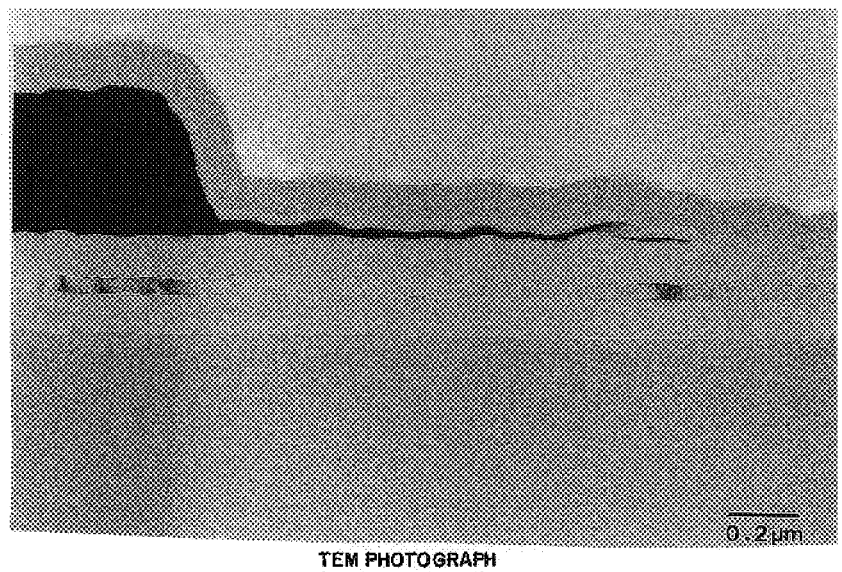
FIG. 11 shows a TEM photograph of a gate electrode of a TFT in a driving circuit of Embodiment 1.

FIG. 11 shows a TEM photograph (cross-section) in the vicinity of the gate electrode of the TFT in the pixel portion.

In this embodiment, the n-channel TFT 309 has a double-gate structure in which two channel forming regions are provided between a source region and a drain region. However, this embodiment is not limited to the double-gate structure. A single gate structure where one channel forming region is formed or a triple gate structure where three channel forming regions are formed may be used.

Impurity regions 253, 254, 265, and 266 that function as one electrode of the storage capacitor 310 are respectively supplied with an impurity element providing an n-type. The storage capacitor 204 is composed of electrodes 239b and 239c, and the semiconductor layer, using the insulating film 207 as a dielectric. In this embodiment, the impurity regions are not overlapped with the electrodes 239b and 239c. If they are overlapped with each other, a capacitance can be further increased.

In the sampling circuit portion 304, typically, the n-channel TFT 308 of an analog switch circuit, an OFF current value is desirably low. In this embodiment, the low-concentration impurity regions 247 and 248 have a concentration gradient, and are designed so as not to be overlapped with the gate electrodes 237b and 237c. Furthermore, regarding a concentration distribution of the respective low-concentration impurity regions 247 and 248, an impurity concentration is increased with distance from the channel forming region 291. If an ON current value or reliability are considered, the low-concentration impurity regions may be overlapped with the gate electrode.

Furthermore, an ON current value or reliability is considered in the p-channel TFT 307, so that the low-concentration impurity regions 272b and 273b are overlapped with the gate electrodes 236a and 236b. Furthermore, regarding a concentration distribution of the respective low-concentration impurity regions 272b and 273b, an impurity concentration is increased with distance from the channel forming region 290. Furthermore, the end portion of the gate electrode in the p-channel TFT 307 is substantially matched with the interface between the low-concentration impurity regions 272b, 273b and the high-concentration impurity regions 272a, 273a via the gate insulating film.

In the p-channel TFT 305 of the logic circuit portion 303, an ON current value or reliability is considered. Therefore, the low-concentration impurity regions 270b and 271b are designed so as to be overlapped with the gate electrodes 234a and 234b. Regarding a concentration distribution of the respective low-concentration impurity regions 270b and 271b, an impurity concentration is increased with distance from the channel forming region 288.

Similarly, the n-channel TFT 306 is designed so that the low-concentration impurity regions 272b and 273b are overlapped with the gate electrodes 235a and 235b. Furthermore, regarding a concentration distribution of the respective low-concentration impurity regions 272b and 273b, an impurity concentration is increased with distance from the channel forming region 289.

Figure 12:
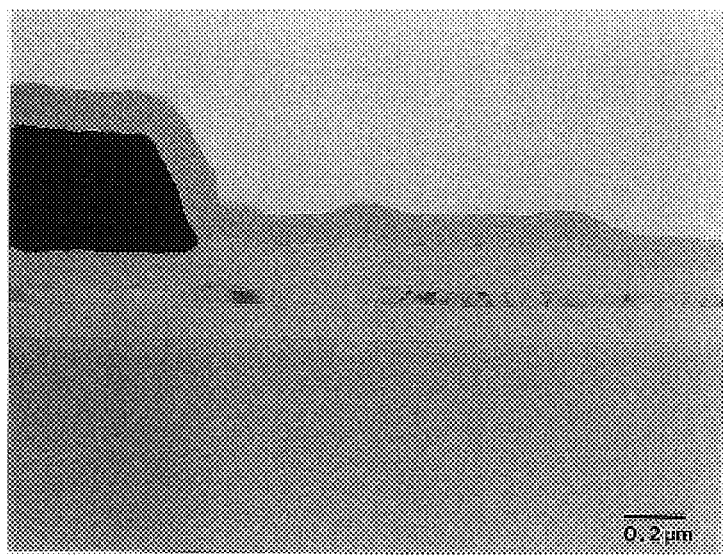
FIG. 12 shows a TEM photograph of a gate electrode of a TFT in a pixel portion of Embodiment 1.

FIG. 12 shows a TEM photograph (cross-section) in the vicinity of the gate electrode of the n-channel TFT 306.

Figure 14:
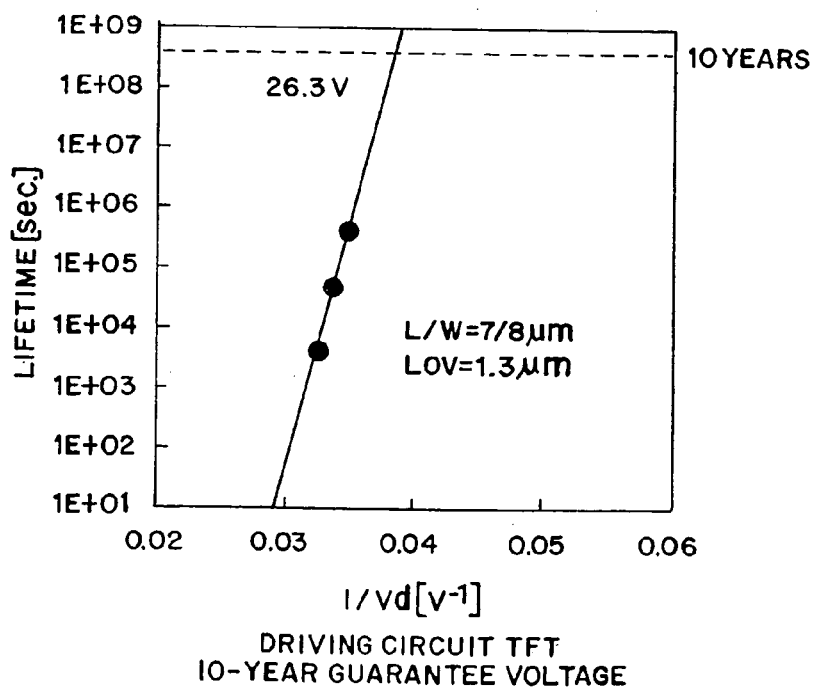
FIG. 14 is a graph showing reliability data (10-year guarantee voltage) of a TFT in a driving circuit of Embodiment 1.

FIG. 14 shows reliability of the n-channel TFT 306 of the driving circuit. Reliability is evaluated by deriving a 10-year guarantee voltage. A 10-year guarantee voltage is obtained by assuming a time required for the maximum value (μFE (max)) of mobility of a TFT to be varied by 10% as a lifetime of the TFT, plotting reciprocals of a drain voltage on a semilogarithmic graph to obtain a linear relationship, and deriving a value of a drain voltage, at which a lifetime becomes 10 years, from the linear relationship.

As shown in FIG. 14, a 10-year guarantee voltage of the n-channel TFT 306 is derived to be 20 V or more, which exhibits high reliability.

The p-channel TFT 305 also exhibits high reliability in a 10-year guarantee voltage.

Figure 15:
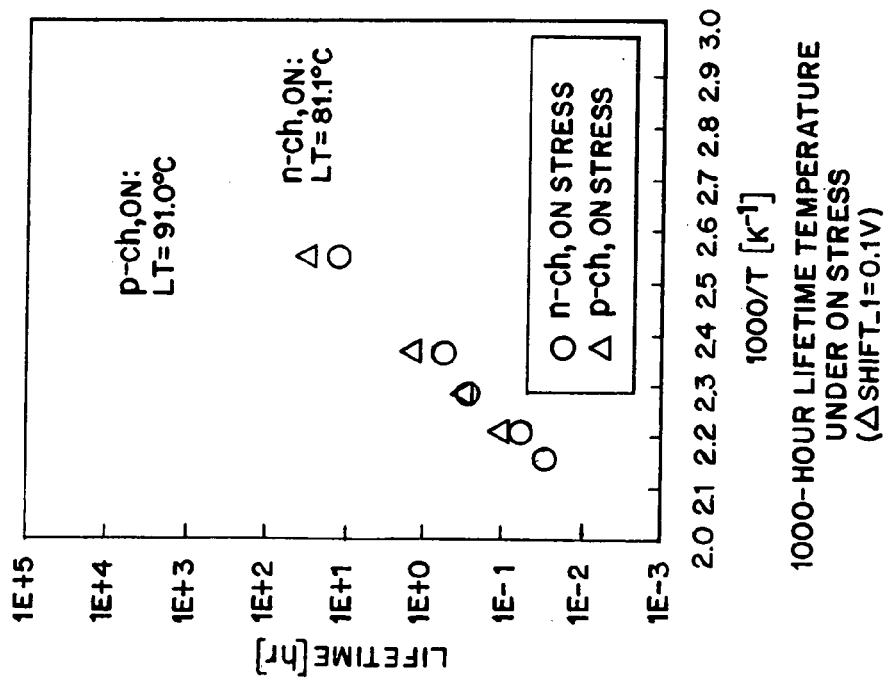
FIG. 15 is a graph showing reliability data (on-stress) of a TFT in a driving circuit of Embodiment 1.

Another evaluation of reliability is also conducted. Herein, in order to derive a 100-hour lifetime temperature under an ON-stress, a time required for TFT characteristics (a rising voltage value (Shift-1) of an I–V curve) to be varied by 0.1 V at Vg=+20 V and Vd=0 V is plotted with respect to 1000/T (T: absolute temperature (K)), and a temperature (lifetime temperature) varied by 0.1 V during 1000 hours is derived. FIG. 15 shows the results. As shown in FIG. 15, a 1000-hour lifetime temperature of the n-channel TFT 306 is 80° C. or higher.

Furthermore, the p-channel TFT 305 also has high reliability at a 1000-hour life temperature under an ON-stress. In the case of the p-channel TFT, Vg and Vd are set to be −20 V and 0 V, respectively.

Figure 16:
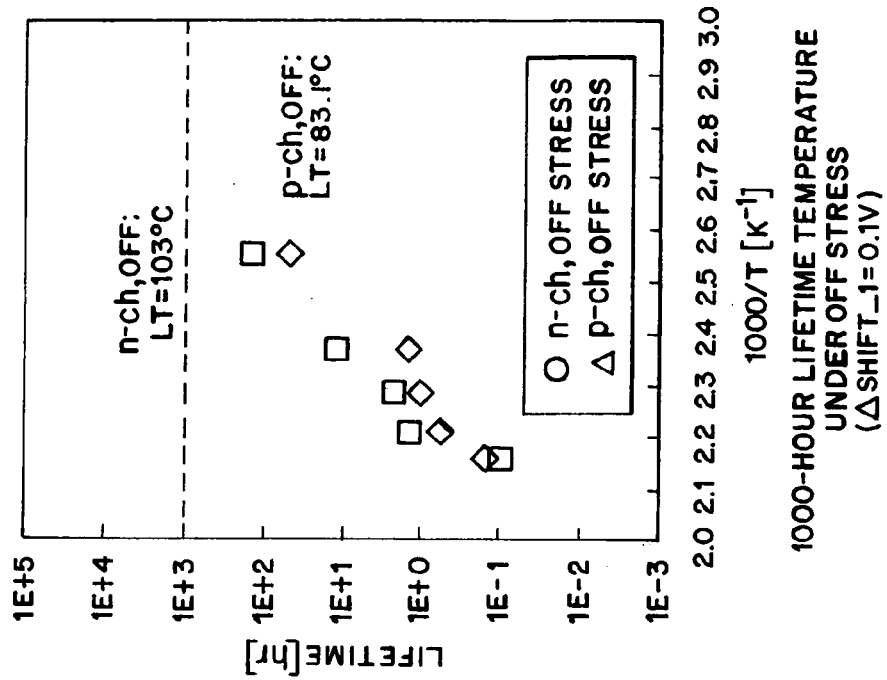
FIG. 16 is a graph showing reliability data (off-stress) of a TFT in a driving circuit of Embodiment 1.

Furthermore, in order to check a 1000-hour lifetime temperature under an OFF-stress, a time required for TFT characteristics (the rising voltage value (Shift-1) of an I–V curve) to be varied by 0.1 V is plotted with respect to 1000/T (T: absolute temperature (K)) at Vg=0 V and Vd=+20 V, and a temperature (lifetime temperature) varied by 0.1 V during 1000 hours is derived. FIG. 16 shows the results. As shown in FIG. 16, a 1000-hour lifetime temperature of the n-channel TFT 306 is 80° C. or higher.

The p-channel TFT 305 also has high reliability in a 1000-hour lifetime temperature under an OFF-stress. In the case of the p-channel TFT, Vg and Vd are set to be 0 V and −20 V, respectively.

Then, in order to derive a change in characteristics of the n-channel TFT under a transient stress, Vd and Vg are set to be +20 V and 2 to 6 V, respectively, and the TFT is left standing at room temperature for 20 hours. FIGS. 17A and 17B show a change in ON-characteristics at this time. As shown in FIG. 17A, a change in the maximum value (μFE(max)) of mobility of the n-channel TFT 306 after 20 hours can be 10% or less. A transient stress refers to a stress involved when a drain voltage is set to a certain value so as to fix a gate voltage In the n-channel TFT 306 of the driving circuit, the width of the low-concentration impurity region overlapped with the gate electrode is 1.5 μm. Depending upon the conventional doping conditions and the like, an impurity may be added by entering a lower portion of the gate electrode. In this case, the width of the low-concentration impurity region overlapped with the gate electrode is about 0.1 μm. Therefore, it is difficult to obtain remarkable effects as shown in this embodiment.

Furthermore, the p-channel TFT 305 also has high reliability under a transient stress. In the case of the p-channel TFT, Vd and Vg are set to be −20 V and −2 to −6 V, respectively. (FIG. 17B)

Figure 24:
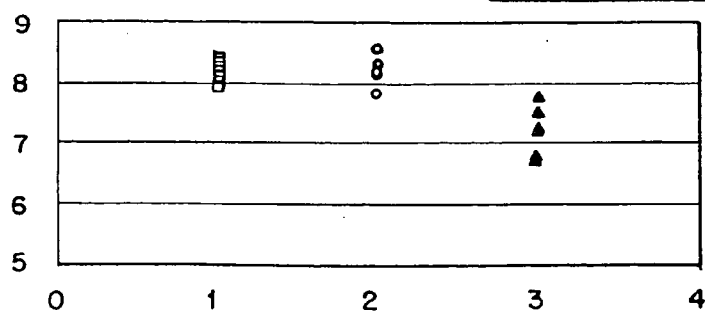
FIG. 24 is a graph showing a ratio of an ON current to an OFF current of Embodiments 1 and 3.

Thus, in this embodiment, a driving circuit having the TFT 306 with high reliability and a pixel portion having the pixel TFT 309 with an OFF current value reduced can be simultaneously formed over the same substrate. Furthermore, since an ON current value of the pixel TFT 309 is at the same level as that of the TFT 306, a ratio of an ON current value to an OFF current value is high. FIG. 24 shows a ratio of an ON current value to an OFF current value. In FIG. 24, "○" represents the pixel TFT of this embodiment. A ratio of an ON current value to an OFF current value is 7.9 to 8.5, which is higher than that of the conventional example represented by "▲". The conventional example is different from this embodiment (low-concentration impurity region having a concentration gradient) in that a TFT has no concentration gradient in the low-concentration impurity region 2 as shown in FIG. 29.

Embodiment 2

In this embodiment, a process for manufacturing an active matrix liquid crystal display device using the active matrix substrate manufactured in Embodiment 1 will be described. The description is made with reference to FIG. 9.

First, after the active matrix substrate with the state of FIG. 8 is obtained according to Embodiment 1, an orientation film 401 is formed on the active matrix substrate of FIG. 8 to perform a rubbing process. Note that, in this embodiment, before the formation of the orientation film 401, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate 400 is prepared. A color filter in which a colored layer 402 and a light shielding layer 403 are arranged corresponding to each pixel is provided in this opposing substrate 400. Also, a light shielding layer 403 is provided in a portion of a driver circuit. A leveling film 404 for covering this color filter and the light shielding layer 403 is provided. Next, a counter electrode 405 made of a transparent conductive film is formed in a pixel portion on the leveling film 404, and then an orientation film 406 is formed on the entire surface of the opposing substrate 400 to perform a rubbing process.

Then, the active matrix substrate in which the pixel portion and the driver circuit are formed and the opposing substrates are adhering to each other by using a sealing member 407. The filler is mixed with the sealing member 407, and two substrates are adhering to each other with a uniform interval by this filler and the columnar spacer. After that, a liquid crystal material 408 is injected into a space between both substrates and then completely encapsulated by a sealing member (not shown). A known liquid crystal material may be used as the liquid crystal material 408. Thus, the active matrix liquid crystal display device as shown in FIG. 9 is completed. If necessary, the active matrix substrate or the opposing substrate is cut with a predetermined shape. Also, a polarization plate and the like are suitably provided using a known technique. And, an FPC is adhering to the active matrix liquid crystal display device using a known technique.

A structure of a liquid crystal module thus obtained will be described using a top view of FIG. 10. Note that the same reference symbols are used for portions corresponding to those of FIG. 9.

Figure 10:
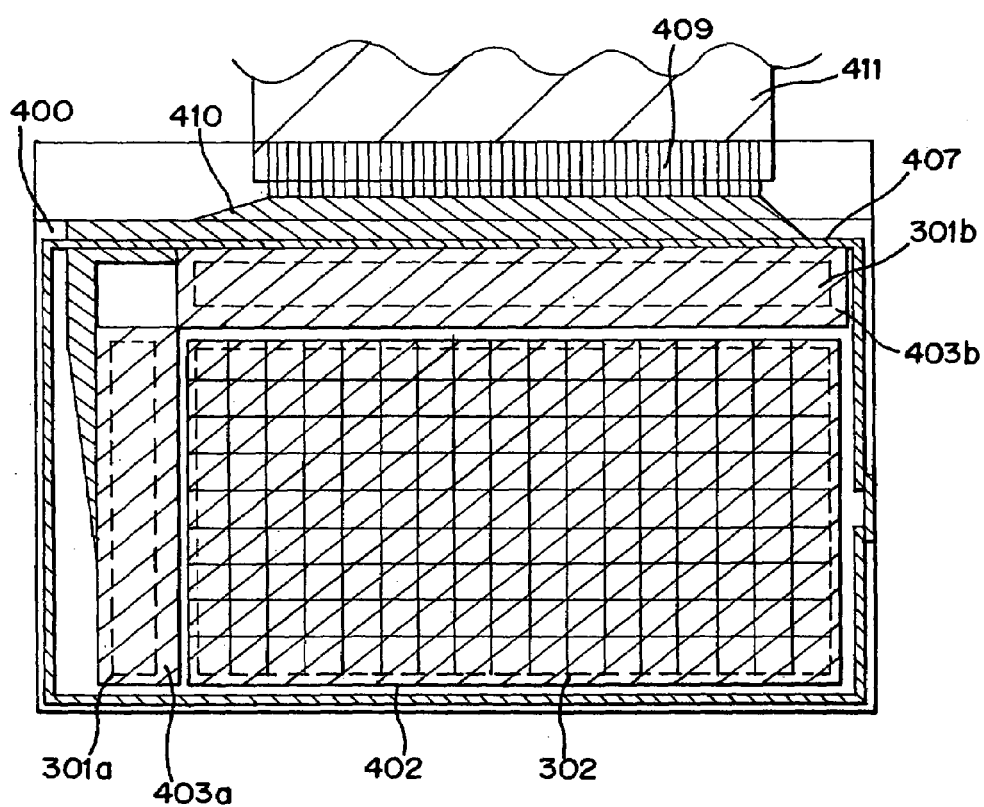
FIG. 10 shows an outer appearance of a liquid crystal module of Embodiment 2.

The top view of FIG. 10 shows the state that the active matrix substrate and the opposing substrate 400 are adhering to each other through the sealing member 407. Over the active matrix substrate, an external input terminal 409 to which the pixel portion, the driver circuit, and the FPC (flexible printed circuit) are adhering, a wiring 410 for connecting the external input terminal 409 with an input portion of the respective circuits, and the like are formed. Also, the color filter and the like are formed in the opposing substrate 400.

A light shielding layer 403a is provided in the opposing substrate side so as to overlap with a gate wiring side driver circuit 301a. Also, a light shielding layer 403b is provided in the opposing substrate side so as to overlap with a source wiring side driver circuit 301b. In a color filter 402 which is provided over the opposing substrate side on a pixel portion 302, a light shielding layer and colored layers for respective colors red color (R), green color (G), and blue color (B) are provided corresponding to each pixel. Actually, a color display is formed using three colors, that is, the colored layer for the red color (R), the colored layer for the green color (G), and the colored layer for the blue color (B). Note that the colored layers for respective colors are arbitrarily arranged.

Here, for a color display, the color filter 402 is provided over the opposing substrate. However, the present invention is not particularly limited to this case, and in manufacturing the active matrix substrate, the color filter may be formed over the active matrix substrate.

Also, in the color filter, the light shielding layer is provided between adjacent pixels such that a portion except for a display region is shielded. The light shielding layers 403a and 403b are provided in a region covering the driver circuit. However, when the liquid crystal display device is incorporated into an electronic device as a display portion thereof, the region covering the driver circuit is covered with a cover. Thus, the color filter may be constructed without the light shielding layer. In manufacturing the active matrix substrate, the light shielding layer may be formed over the active matrix substrate.

Also, without providing the light shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light-shielded.

Also, the FPC 411 which is composed of the base film and the wiring is adhering to the external input terminal by using an anisotropic conductive resin. Further, a reinforced plate is provided to increase a mechanical strength.

The liquid crystal module manufactured above can be used as the display portion of various electronic equipment.

Embodiment 3

Figure 18:
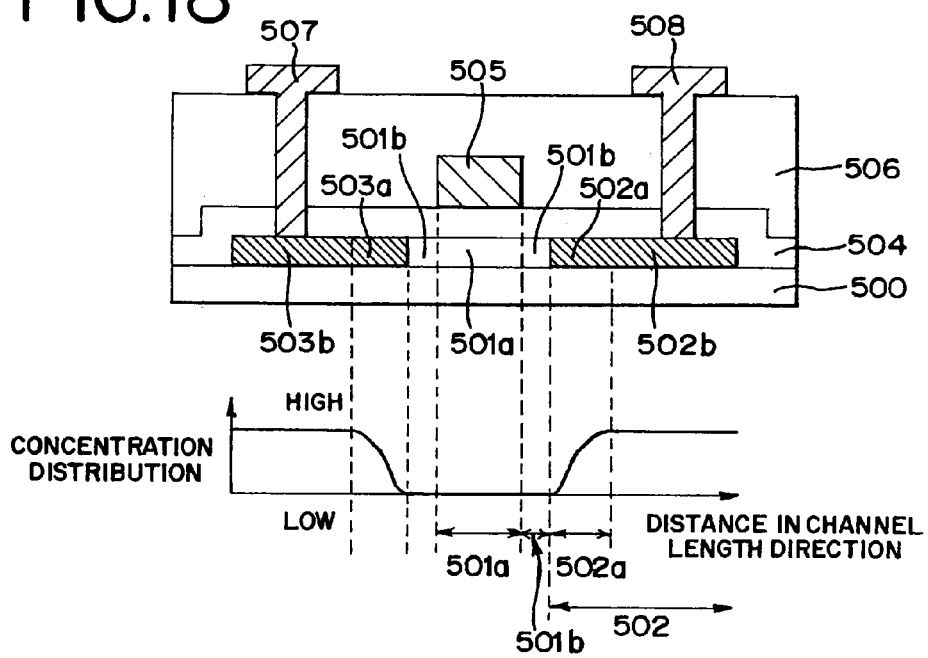
FIG. 18 shows a constitution of Embodiment 3.

In this embodiment, the case will be described in which an offset region is provided between a channel forming region and a low-concentration impurity region. FIG. 18 is a schematic view thereof.

Referring to FIG. 18, in offset regions 501*b* and impurity regions (LDD regions, source region or drain region) 502*a*, 502*b*, 503*a*, and 503*b* provided so as to interpose a channel forming region 501*a* therebetween, it is assumed that there is a concentration distribution in which a concentration of an impurity element imparting one conductivity is increased with distance from the channel forming region 501*a*. More specifically, there is provided an impurity region 502 in which a concentration of an impurity element (phosphorus) is gradually increased with distance from the end portion of the gate electrode 505 in the channel length direction toward the periphery portion of the semiconductor layer.

In this embodiment, the impurity region 502 having such a concentration gradient is intentionally formed. Furthermore, an offset region is formed between a channel forming region and a low-concentration impurity region. Thus, a considerably low OFF current value can be obtained. A gate electrode 505 is overlapped with the channel forming region 501*a* via a gate insulating film 504. However, the gate electrode 505 is arranged so as not to overlap with the offset region 501*b* and the impurity region 502. In FIG. 18, reference numeral 500 denotes a substrate having an insulating surface, 506 denotes an interlayer insulating film, and 507 and 508 denote a source electrode and a drain electrode.

In the present specification, the offset region 501*b* refers to a region that has substantially the same impurity concentration as that of the channel forming region 501, and is not overlapped with the gate electrode 505.

In order to produce the offset regions 501*b*, etching processing using etching gas with a low selection ratio with respect to W may be conducted during the third etching process shown in Embodiment 1. Alternatively, it may also be possible that, after forming impurity regions, an electrode in a tapered shape is subjected to isotrophic etching to form the offset regions 501*b*.

Figure 19:
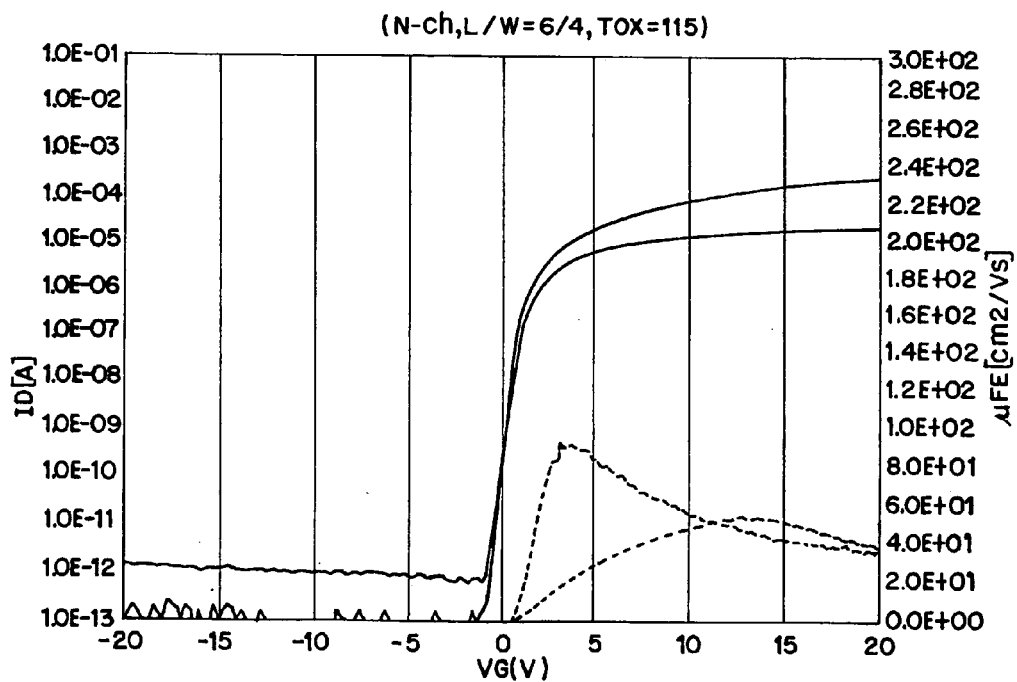
FIG. 19 shows voltage/current characteristics of a TFT in a pixel portion of Embodiment 3.

FIG. 19 shows voltage/current characteristics of a TFT (L/W=6×2 µm/4 µm, and width of an offset region: 0.5 µm; width of an LDD region: 1.5 µm) of this embodiment. Because of a double-gate structure, the two channel forming region, L/W=6 µm/4 µm is represented as L/W=6×2 µm/4 µm. A threshold value (Vth) of the TFT is 0.715 V, an S value is 0.243 V/dec, field effect mobility (µFE) is 90.7 cm$^2$/Vs, an ON current value is 7.85×10$^{-5}$ A at Vds=14 V, and an OFF current value is 9.5×10$^{-13}$ A at Vds=14 V. In FIG. 19, these show satisfactory TFT characteristics values. In particular, an OFF current value is very low, and a ratio of an ON current value to an OFF current value is high, so that the TFT of this embodiment is suitable as a pixel TFT. In FIG. 24, "□" represents the pixel TFT of this embodiment, and a ratio of an ON current value to an OFF current value is 7.9 to 8.4, which is higher than the conventional example represented by "▲".

Figure 20:
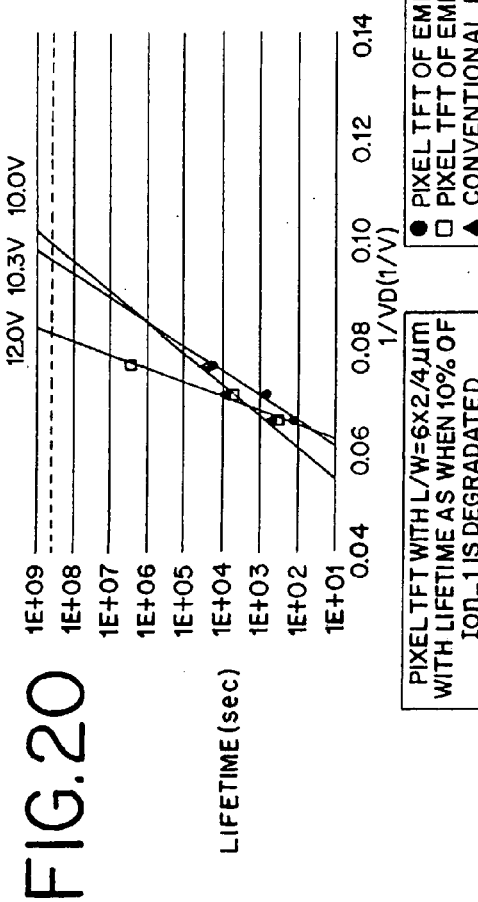
FIG. 20 is a graph showing reliability data (10-year guarantee voltage) of a TFT in a pixel portion of Embodiment 3.

Furthermore, FIG. 20 shows a change in characteristics of the n-channel TFT under a transient stress. FIG. 20 also shows, as comparative examples, the pixel TFT (●) of Embodiment 1 and the pixel TFT (▲) of the conventional example (low-concentration impurity region without concentration gradient). As shown in FIG. 20, the pixel TFT (10-year guarantee voltage: 12 V) of this embodiment represented by "□" exhibits higher reliability than that of the conventional example (10-year guarantee voltage: 10 V) and Embodiment 1 (10-year guarantee voltage: 10.3 V).

Embodiment 4

In this embodiment, an active matrix substrate different from that of Embodiment 1 and a method of manufacturing the same will be described with reference to FIGS. 21 and 22. In this embodiment, a transmission type display apparatus is formed by using a transparent conductive film for a pixel electrode. As the transparent conductive film, an alloy of indium oxide and tin oxide (ITO), an alloy of indium oxide and zinc oxide (In$_2$O$_3$—ZnO), zinc oxide (ZnO), and the like may be used.

In this embodiment, after an interlayer insulating film 609 is formed, a pixel electrode 600 made of a transparent conductive film is patterned using a photomask. Thereafter, contact holes are formed in the interlayer insulating film 609. Then, a connecting electrode 611 is formed so as to be overlapped with the pixel electrode 600. The connecting electrode 611 is connected to a drain region 625 through the contact hole. A source electrode and a drain electrode of another TFT are also formed simultaneously with the connecting electrode 611.

Figure 21:
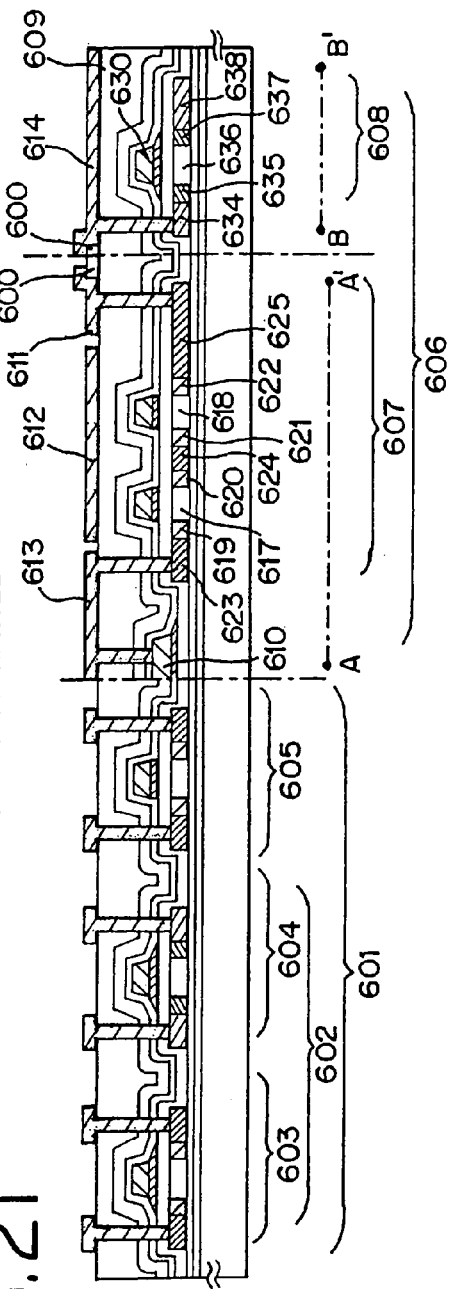
FIG. 21 is a cross-sectional view of an active matrix substrate of Embodiment 4.

Furthermore, as shown in FIG. 21, a source line 610 of the pixel portion is formed on the same insulating film as that of a gate electrode 629, and is connected to a source region 623 of an n-channel TFT 607 of the pixel portion through a connecting electrode 613.

A gate line 612 is formed on an insulating film 609 different from that of the gate electrode 629, and is connected to the gate electrode 629 through the contact hole. The gate line 612 also functions as a light-blocking film for blocking light to channel forming regions 617 and 618.

In the pixel portion 606, an n-channel TFT 607 and a storage capacitor 608 are formed. The n-channel TFT 607 has a double-gate structure, which is the same as that of the n-channel TFT 309 in FIG. 8. The channel forming regions 617 and 618, low-concentration impurity regions 619 to 622, and high-concentration impurity regions 623 to 625 constitute an active layer. Reference numeral 623 denotes a source region, and 625 denotes a drain region.

One electrode 630 constituting the storage capacitor 608 is formed in the same pattern as that of the gate electrode 629. The other electrode is a semiconductor layer composed of high-concentration impurity region 634 and 638 with boron of high concentration added thereto, low-concentration impurity region 635 and 637, and a region 636 with an impurity element hardly added thereto. The high-concentration impurity region 634 is connected to the connecting electrode 614 through the pixel electrode 600 and the contact hole.

In the pixel structure of this embodiment, the end portion of the pixel electrode 600 is arranged so as to be overlapped with the source line 610 in such a manner that a gap between the pixel electrodes is shielded from light without using a black matrix.

The driving circuit 601 has the same structure as that of Embodiment 1. Therefore, the detailed description thereof will be omitted here. An n-channel TFT 603 corresponds to the n-channel TFT 306 in FIG. 9. A p-channel TFT 604 corresponds to the p-channel TFT 305 in FIG. 9. An n-channel TFT 605 corresponds to the n-channel TFT 308.

Figure 22:
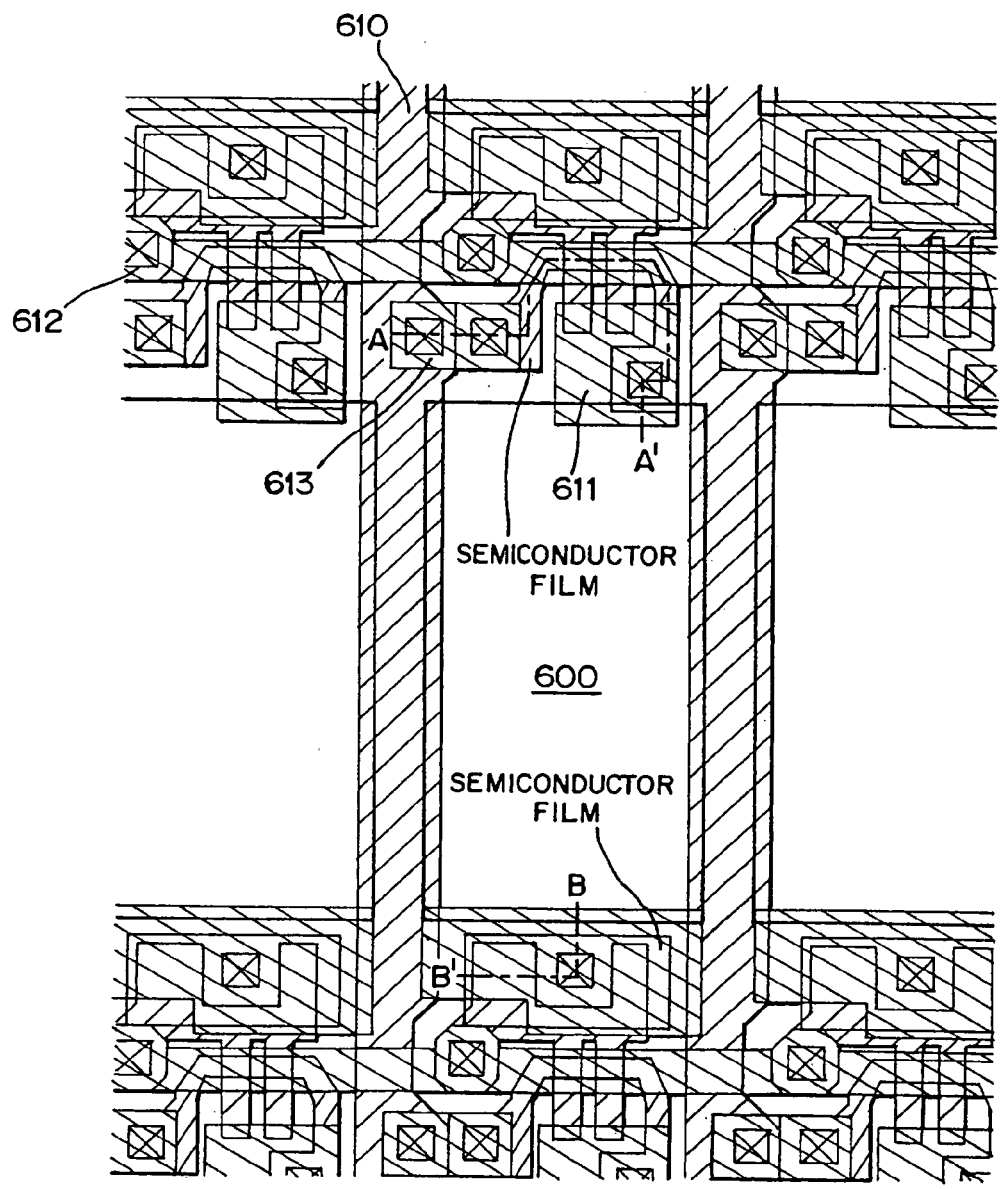
FIG. 22 is a top view showing a pixel of Embodiment 4.

FIG. 22 is a top view of a pixel portion of an active matrix substrate manufactured in this embodiment. The components corresponding to those in FIG. 21 are denoted with the same reference numerals as those therein. A dashed line A–A' in FIG. 21 corresponds to a cross-section taken along a dashed line A–A' in FIG. 22. A dashed line B–B' in FIG. 21 corresponds to a cross-section taken along a dashed line B–B' in FIG. 22.

Furthermore, if the processes described in this embodiment are conducted, the number of photomasks required for manufacturing an active matrix substrate may be six. This shortens production processes, and contributes to the reduction in a production cost and enhancement of yield.

Embodiment 5

In this embodiment, exemplary production of a light-emitting display apparatus provided with an electroluminescence (EL) element will be described with reference to FIGS. 25A and 25B.

Figure 25A:
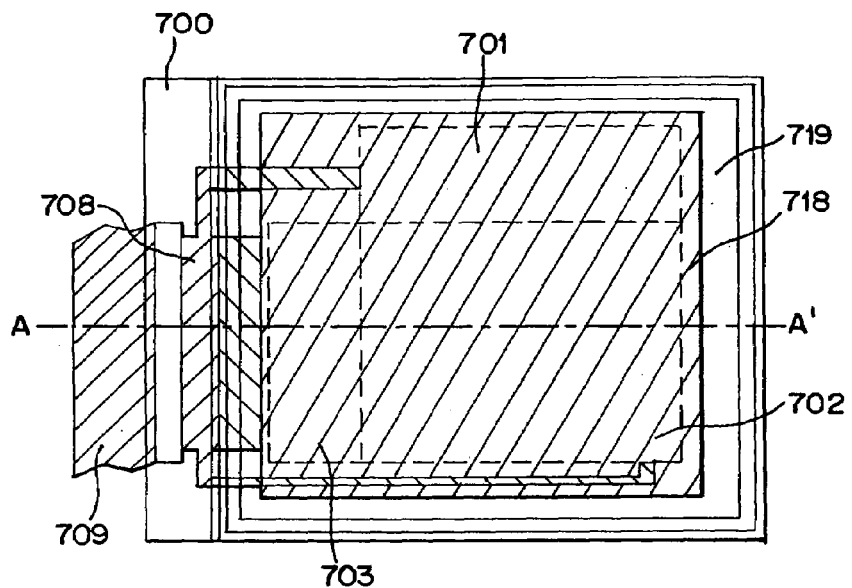
FIGS. 25A and 25B are a top view and a cross-sectional view showing an EL module of Embodiment 5.

FIG. 25A is a top view showing an EL module. FIG. 25B is a cross-sectional view taken along a line A-A' in FIG. 25A. A pixel portion 702, a source-side driving circuit 701, and a gate-side driving circuit 703 are formed on a substrate 700 (e.g., a glass substrate, a crystallized glass substrate, a plastic substrate, or the like) having an insulating surface. Furthermore, reference numerals 718 and 719 denote a sealant and a protective (DLC) film, respectively. The pixel portion and the driving circuit portion are covered with a sealant 718, and the sealant is covered with the protective film 719. The layered structure is further sealed with a cover material using an adhesive.

Reference numeral 708 denotes connection wiring for transmitting a signal to be input to the source-side driving circuit 701 and the gate-side driving circuit 703, which receives a video signal and a clock signal from a flexible printed circuit (FPC) 709 to be an external input terminal. Herein, although only the FPC is shown, the FPC may be provided with a printed wiring board (PWB). In the present specification, the light-emitting apparatus intends to include not only a body of a light-emitting apparatus but also the apparatus provided with an FPC or PWB.

Next, the cross-sectional structure of the above-mentioned EL module will be described with reference to FIG. 25B. An insulating film 710 is formed on a substrate 700. The pixel portion 702 and the gate-side driving circuit 703 are formed above the insulating film 710. The pixel portion 702 is composed of a plurality of pixels including a current control TFT 711 and a pixel electrode 712 electrically connected to a drain of the current control TFT 711. The gate-side driving circuit 703 is formed of a CMOS circuit obtained by combining an n-channel TFT 713 and a p-channel TFT 714.

The TFTs (including 711, 713, and 714) may be provided in accordance with Embodiment 1 or 3.

The pixel electrode 712 functions as a positive electrode (anode) of the EL element. Banks 715 are formed at both ends of the pixel electrode 712. An EL layer 716 and a negative electrode (cathode) 717 of the EL element are formed on the pixel electrode 712.

The EL layer 716 (for emitting light and moving carriers for light emission) may be formed by appropriately combining a light-emitting layer, a charge transfer layer, and a charge injection layer. For example, a low molecular organic EL material and a high molecular organic EL material may be used. Furthermore, as the EL layer, a thin film made of a light-emitting material (singlet compound) that emits light (fluoresces) due to singlet excitation, or a thin film made of a light-emitting material (triplet compound) that emits light (phosphoresces) due to triplet excitation may be used. As the charge transfer layer and the charge injection layer, an inorganic material such as silicon carbide can be used. As organic EL materials and inorganic materials, materials which are known can be used.

A negative electrode (cathode) 717 may function as wiring common to all the pixels, and is electrically connected to the FPC 709 via the connection wiring 708. All the elements contained in the pixel portion 702 and the gate-side driving circuit 703 are covered with the negative electrode 717, the sealant 718, and the protective film 719.

As the sealant 718, it is preferable to use a material that is transparent or semi-transparent as much as possible to visible light. It is also desirable that the sealant 718 is made of a material transmitting moisture or oxygen as less as possible.

Figure 25B:
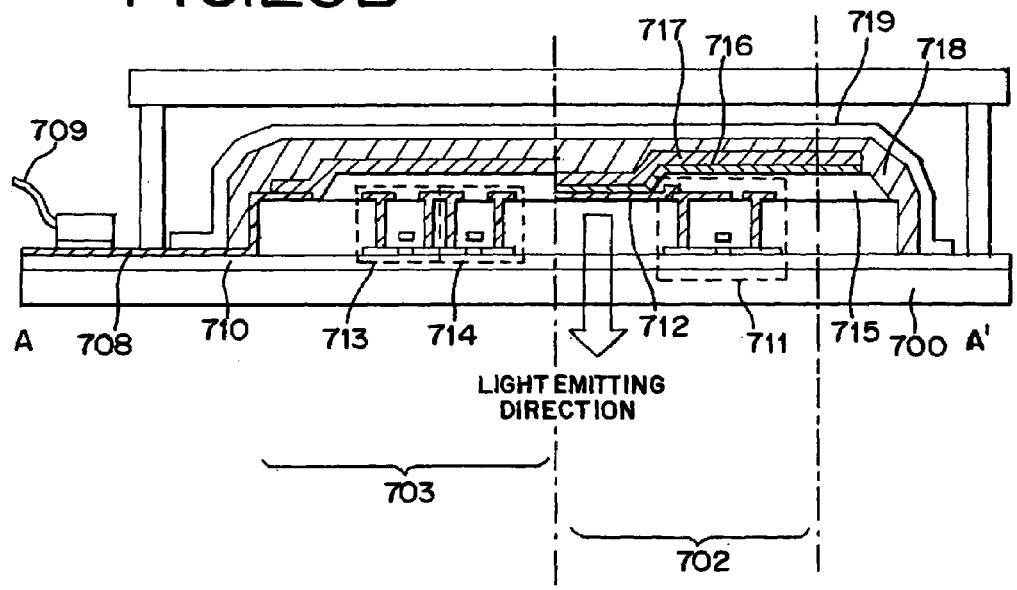

It is also preferable that after the light-emitting element is completely covered with the sealant 718, the protective film 719 made of a DLC film or the like is provided at least over the surface (exposed surface) of the sealant 718 as shown in FIG. 25B. A protective film may also be provided over the entire surface of the substrate including its reverse surface. Herein, care should be taken so that a protective film is not formed on a portion in which the external input terminal (FPC) is provided. A protective film may be prevented from being formed by using a mask. Alternatively, a protective film may be prevented from being formed by covering the external input terminal portion with a tape used as a masking tape in a CVD apparatus.

The EL element is sealed with the sealant 718 and the protective film with the above-mentioned structure, whereby the EL element can be completely cut off from outside, and a material accelerating degradation of the EL layer by oxidation, such as moisture and oxygen, can be prevented from entering from outside. Thus, a light-emitting apparatus with high reliability can be obtained.

It may also be possible that the pixel electrode is made of a negative electrode, and the EL layer and a positive electrode are stacked so that light is emitted in an opposite direction to that shown in FIG. 25B. An active layer in each TFT is covered with a gate insulating film, and a gate electrode is formed so as to be overlapped with a channel forming region via the gate insulating film. Furthermore, an interlayer insulating film is provided so as to cover the gate electrode, and an electrode is provided on the interlayer insulating film so as to be electrically connected to a source region or a drain region of each TFT. There is also provided a negative electrode electrically connected to a current control TFT that is an n-channel TFT. Furthermore, an insulating layer is provided which has openings so as to cover the end portions of the negative electrode to form tapered edges. Furthermore, an organic layer and an organic compound layer composed of a hole injection layer are provided on the negative electrode, and a positive electrode is provided on the organic compound layer, whereby the light-emitting element is formed.

According to this embodiment, a light-emitting apparatus can be obtained, which has a light-emitting element with a structure in which light generated in the organic compound layer (EL layer) is taken in a direction opposite to an arrow direction indicated by arrow in FIG. 25B.

Embodiment 6

The driver circuit portion and the pixel portion fabricated by implementing the present invention can be utilized for various modules (active matrix liquid crystal module, active matrix EL module and active matrix EC module). Namely, the present invention can be implemented onto all of the electronic apparatuses that incorporate such modules as a display portion.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 26A–26F, 27A–27D and 28A–28C.

Figure 26A:
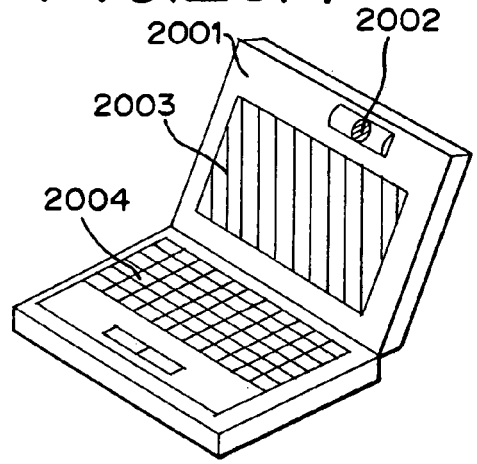
FIGS. 26A to 26F show exemplary electronic apparatuses of Embodiment 6.

FIG. 26A is a personal computer which comprises: a main body 2001; an image input section 2002; a display section 2003; and a key board 2004. The present invention can be applied to the display section 2003.

Figure 26B:
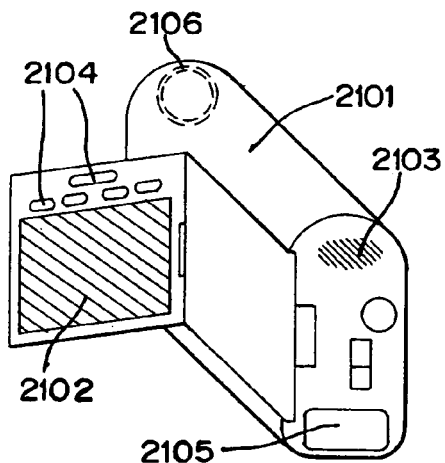

FIG. 26B is a video camera which comprises: a main body 2101; a display section 2102; a voice input section 2103; operation switches 2104; a battery 2105 and an image receiving section 2106. The present invention can be applied to the display section 2102.

Figure 26C:
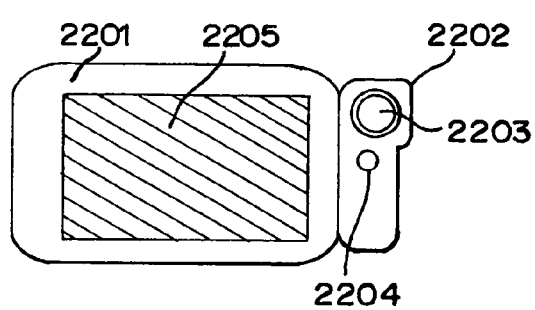

FIG. 26C is a mobile computer which comprises: a main body 2201; a camera section 2202; an image receiving section 2203; operation switches 2204 and a display section 2205. The present invention can be applied to the display section 2205.

Figure 26D:
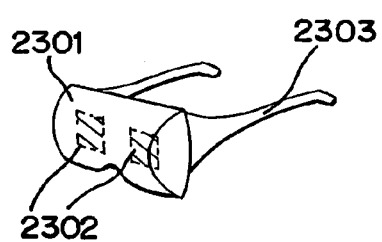

FIG. 26D is a goggle type display which comprises: a main body 2301; a display section 2302; and an arm section 2303. The present invention can be applied to the display section 2302.

Figure 26E:
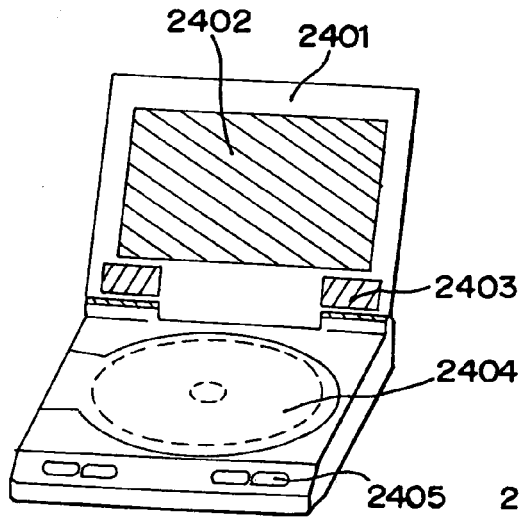

FIG. 26E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet. The present invention can be applied to the display section 2402.

Figure 26F:
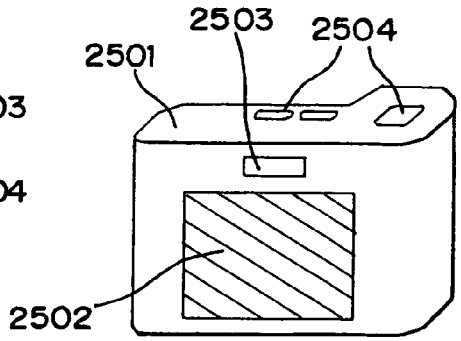

FIG. 26F is a digital camera which comprises: a main body 2501; a display portion 2502; a view finder 2503; operation switches 2504; and an image receiving section (not shown in the figure). The present invention can be applied to the display section 2502.

Figure 27A:
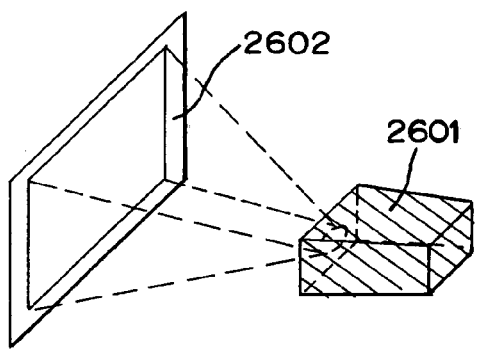
FIGS. 27A to 27D show exemplary electronic apparatuses of Embodiment 6.

FIG. 27A is a front type projector which comprises: a projection system 2601; and a screen 2602. The present invention can be applied to the liquid crystal module 2808 which forms a part of the projection system 2601.

Figure 27B:
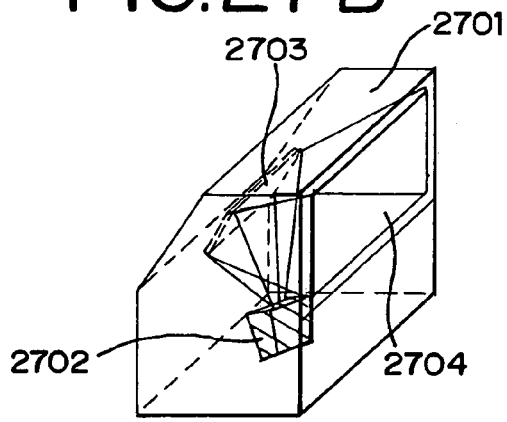

FIG. 27B is a rear type projector which comprises: a main body 2701; a projection system 2702; a mirror 2703; and a screen 2704. The present invention can be applied to the liquid crystal module 2808 which forms a part of the projection system 2702.

Figure 27C:
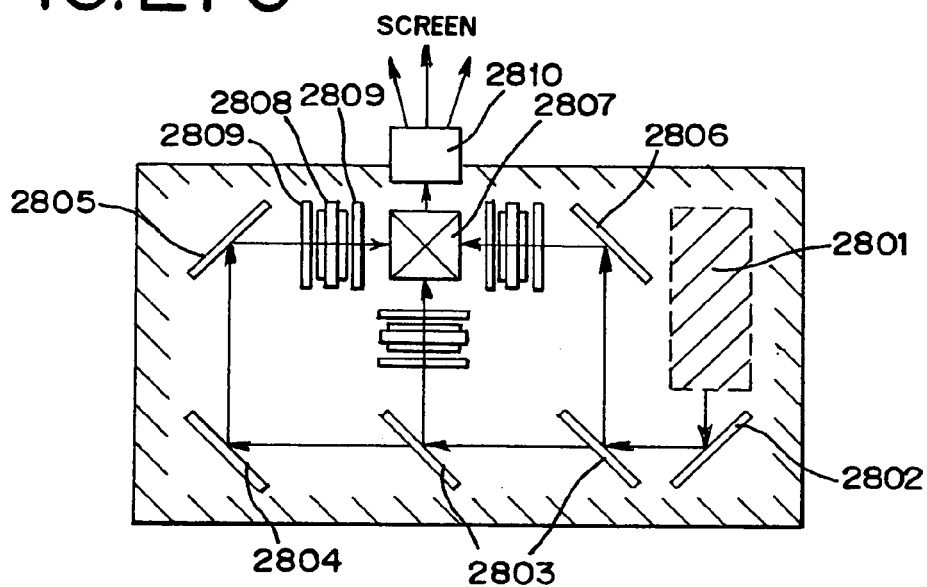

FIG. 27C is a diagram which shows an example of the structure of a projection system. 2601 and 2702 in FIGS. 27A and 27B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though the present embodiment shows an example of 3-plate type, this is not to limit to this example and a single plate type may be used for instance.

Further, an operator may appropriately dispose an optical lens, a film which has a function to polarize light, a film which adjusts a phase difference or an IR film, etc. in the optical path shown by an arrow in FIG. 27C.

Figure 27D:
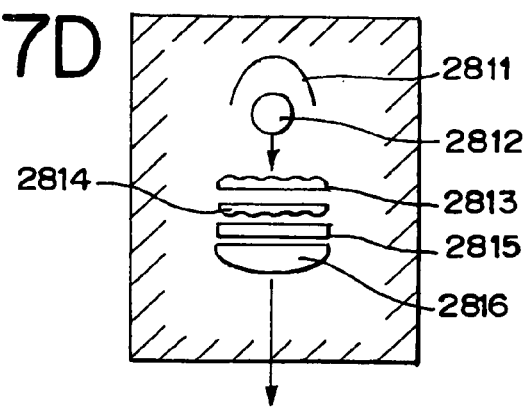

FIG. 27D is a diagram showing an example of a structure of an optical light source system 2801 in FIG. 27C. In the present embodiment the optical light source system 2801 comprises: a reflector 2811; a light source 2812; lens arrays 2813 and 2814; a polarizer conversion element 2815; and a collimator lens 2816. Note that the optical light source system shown in FIG. 27D is merely an example and the structure is not limited to this example. For instance, an operator may appropriately dispose an optical lens, a film which has a function to polarize light, a film which adjusts a phase difference or an IR film, etc.

Note that the projectors shown FIGS. 27A–27D are the cases of using a transmission type electro-optical devices, and applicable examples of a reflection type electro-optical device and an EL module are not shown.

Figure 28A:
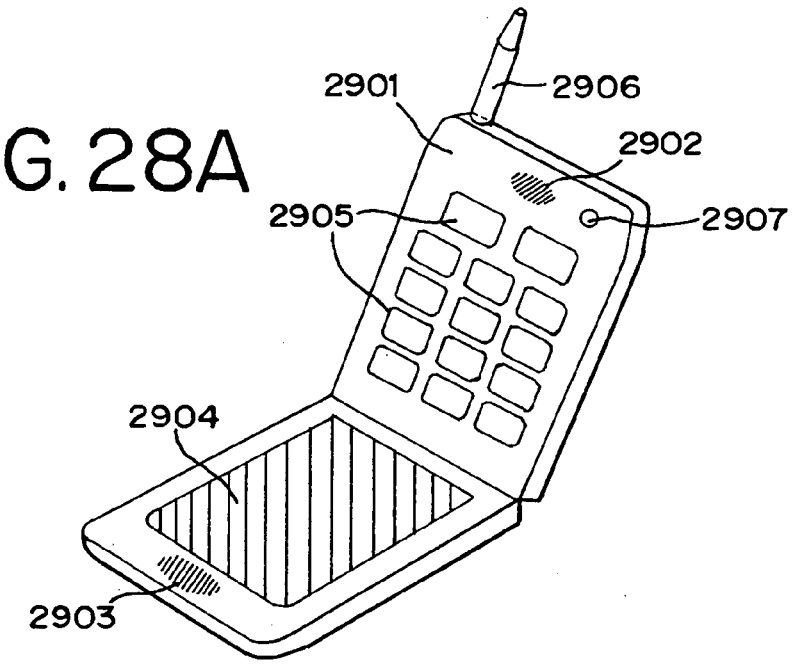
FIGS. 28A to 28C show exemplary electronic apparatuses of Embodiment 6.

FIG. 28A is a mobile phone which comprises: a main body 2901; a voice output section 2902; a voice input section 2903; a display section 2904; operation switches 2905; an antenna 2906; and an image input section (CCD, image sensor, etc.) 2907 etc. The present invention can be applied to the display section 2904.

Figure 28B:
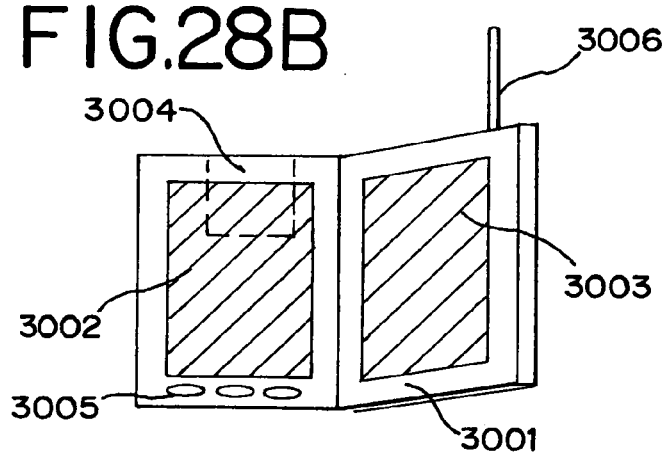

FIG. 28B is a portable book (electronic book) which comprises: a main body 3001; display sections 3002 and 3003; a recording medium 3004; operation switches 3005 and an antenna 3006 etc. The present invention can be applied to the display sections 3002 and 3003.

Figure 28C:
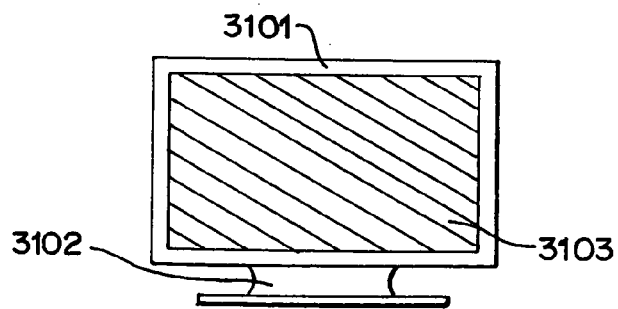

FIG. 28C is a display which comprises: a main body 3101; a supporting section 3102; and a display section 3103 etc. The present invention can be applied to the display section 3103.

Further, the display shown in FIG. 28C is a medium-small type or big type, for example, 5 to 20 inches display size. It is preferable that the mass-producing of the display is performed to form displays of such sizes by multiple cutting from a substrate which is composed by not less than 1 m length of one side.

As described above, the applicable range of the present invention is very large, and the invention can be applied to electronic apparatuses of various areas. Note that the electronic devices of the present embodiment can be achieved by utilizing any combination of constitutions in Embodiments 1 to 5.

Embodiment 7

In this embodiment, in a TFT (channel length: L/channel width: W=10 μm/8 μm) of a driving circuit, a relationship between a length of an impurity region (that is also referred to as an "Lov region") overlapped with a gate electrode in a channel length direction and reliability will be described.

Figure 31:
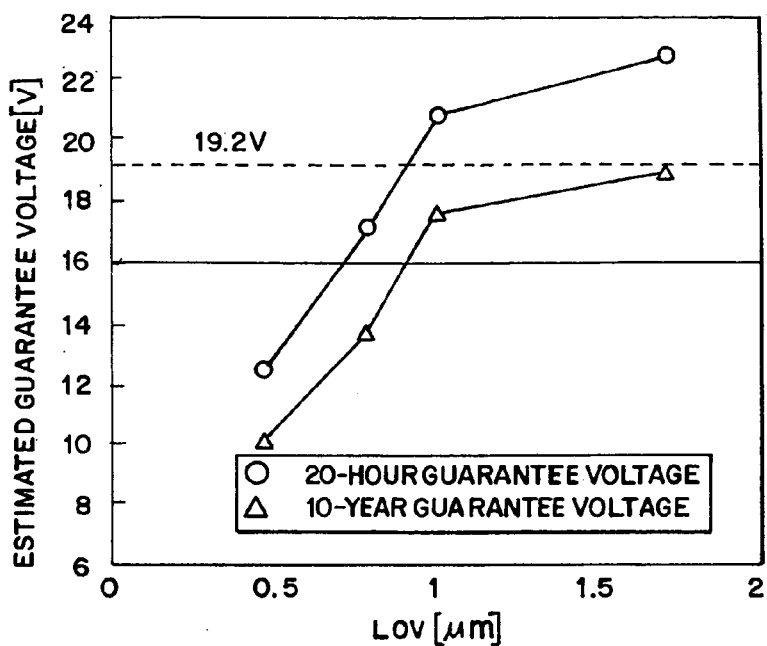
FIG. 31 is a graph showing a relationship between the reliability of a TFT in a driving circuit (20-hour guarantee voltage, and 10-year guarantee voltage) and the $L_{OV}$ length of Embodiment 7.

In FIG. 14, a time required for the maximum value (μFE (max)) of mobility of a TFT to be varied by 10% is assumed as a lifetime of the TFT in the case where the length of the Lov region is 1.5 μm. Reciprocals of a drain voltage are plotted on a semilogarithmic graph to obtain a linear relationship, and a value of a drain voltage, at which a lifetime becomes 10 years, is derived from the linear relationship as a 10-year guarantee voltage. According to this embodiment, in the case where the length of the Lov region is prescribed to be 0.5 μm, 0.78 μm, 1 μm, 1.5 μm, and 1.7 μm, respectively, a time required for an ON current value of a TFT to be varied by 10% is assumed to be a life of the TFT. Reciprocals of a drain voltage are plotted on a semilogarithmic graph to obtain a linear relationship, and a value of a drain voltage, at which a life becomes 10 years, is derived from the linear relationship as a 10-year guarantee voltage. FIG. 31 shows the results.

FIG. 31 also shows the results obtained by deriving a value of a drain voltage, at which a time required for an ON current value of a TFT to be varied by 10% is 20 hours in a transient text, as a 20-hour guarantee voltage.

As shown in FIG. 31, assuming that a TFT is used in a 16 V-level apparatus and considering 20% margin, the length of the Lov region of an n-channel TFT to be 19.2 V (16×1.2) or more is preferably 1 µm or more at a 20-hour guarantee voltage, and 1.5 µm or more at a 10-hour guarantee voltage.

Embodiment 8

In this embodiment, in a case that the gate electrode is arranged as line width design sizes of 3–10 µm, a relationship between the line width design sizes and lengths in the channel length direction of the impurity region (as called Lov region) overlapped with the gate electrode is shown in FIG. 32. Note, the "line width" is same as a "wiring width". In Embodiment 8, a width of the gate electrode is described as an example.

According to Embodiment 1, when the gate electrode having the taper shape is formed by etching, a length of Lov region varies depending on the line width.

The line widths to be obtained are defined as 3 µm, 4 µm, 6 µm, 8 µm and 10 µm, with respect to the length (Lov length) in the channel length direction of the Lov region which is formed the same etching as Embodiment 1, the average values thereof are measured. Note, the length of Lov region here corresponds to a length of the taper portion formed in an end portion of each side of the gate electrode.

When the line width to be obtained is 3 µm, the average value of the Lov length is 1.09 µm and an average value of the channel length is 0.86 µm. That is, according to 0.86+ 2×(1.09)=3.04 µm, the gate electrode width of 3.04 µm is obtained.

Further, as shown in FIG. 32, in a case that the line width is 4 µm, the average value of Lov length is 1.13 µm; 6 µm, 1.24 µm; 8 µm, 1.32 µm; and 10 µm, 1.39 µm, respectively.

Accordingly, it is preferable to determine the line widths of wirings used in the pixel portion and the driving circuit portion based on the data in order to arrange Lov lengths to be necessary.

According to the present invention, a pixel TFT having a considerably low OFF current value and a high ratio of an ON current value to an OFF current value can be realized. Furthermore, a driving circuit is provided with a TFT having a high ON current value and high reliability, so that a semiconductor apparatus having excellent display characteristics can be realized. Furthermore, since an impurity region is formed by using a taper portion, the number of processes is reduced, whereby a production cost can be reduced and production yield can be enhanced.

What is claimed is:

1. A method of manufacturing a semiconductor device, said method comprising the steps of:
   forming a semiconductor film on an insulating surface;
   forming an insulating film on the semiconductor film;
   forming a conductive film having a taper portion on the insulating film;
   adding an impurity element imparting one conductivity type to the semiconductor film through the taper portion and the insulating film to form an impurity region;
   selectively removing only a taper portion of the conductive film to form a gate electrode; and
   forming an interlayer insulating film over the gate electrode,
   wherein an impurity concentration is increased toward an end portion of the taper portion in the impurity region after forming the interlayer insulating film.

2. A method of manufacturing a semiconductor device, said method comprising the steps of:
   forming a semiconductor film on an insulating surface;
   forming an insulating film on the semiconductor film;
   forming a conductive film on the insulating film, the conductive film having a taper portion on the insulating film;
   etching the insulating film;
   adding an impurity element imparting one conductivity type to the semiconductor film through the taper portion and the insulating film to form an impurity region;
   selectively removing only a taper portion of the conductive film to form a gate electrode; and
   forming an interlayer insulating film over the gate electrode,
   wherein an impurity concentration is increased toward an end portion of the taper portion in the impurity region after forming the interlayer insulating film.

* * * * *